US012696505B2

(12) United States Patent
Shiga et al.

(10) Patent No.: US 12,696,505 B2
(45) Date of Patent: Jul. 28, 2026

(54) AUTO-DOPING REDUCTION IN SEMICONDUCTOR STRUCTURE

(71) Applicant: TEXAS INSTRUMENTS INCORPORATED, Dallas, TX (US)

(72) Inventors: Takashi Shiga, Tsukuba (JP); Hiromi Endoh, Inashiki City (JP); Tatsuya Tominari, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 513 days.

(21) Appl. No.: 18/299,188

(22) Filed: Apr. 12, 2023

(65) Prior Publication Data

US 2024/0347605 A1 Oct. 17, 2024

(51) Int. Cl.
| | |
|---|---|
| *H10D 62/60* | (2025.01) |
| *H10P 30/20* | (2026.01) |
| *H10D 30/65* | (2025.01) |
| *H10D 30/83* | (2025.01) |
| *H10D 84/60* | (2025.01) |
| *H10D 84/85* | (2025.01) |

(52) U.S. Cl.
CPC ........... *H10D 62/60* (2025.01); *H10P 30/204* (2026.01); *H10P 30/21* (2026.01); *H10D 30/65* (2025.01); *H10D 30/83* (2025.01); *H10D 84/645* (2025.01); *H10D 84/859* (2025.01)

(58) Field of Classification Search
None
See application file for complete search history.

(56) References Cited

U.S. PATENT DOCUMENTS

| | | | | |
|---|---|---|---|---|
| 4,939,099 A | * | 7/1990 | Seacrist | H10D 84/0121 |
| | | | | 257/532 |
| 4,978,630 A | * | 12/1990 | Kim | H10D 64/111 |
| | | | | 438/327 |
| 5,068,756 A | * | 11/1991 | Morris | H10D 84/05 |
| | | | | 257/E27.012 |
| 10,347,621 B2 | | 7/2019 | Kim | |
| 2004/0033666 A1 | * | 2/2004 | Williams | H10P 30/204 |
| | | | | 438/297 |
| 2009/0146258 A1 | * | 6/2009 | Zhang | H10D 84/038 |
| | | | | 438/207 |
| 2015/0270162 A1 | * | 9/2015 | Kao | H10D 30/0285 |
| | | | | 438/413 |

OTHER PUBLICATIONS

B. El-Kareh, et al., "A 5V complementary-SiGe BiCMOS technology for high-speed precision analog circuits," 2003 Proceedings of the Bipolar/BiCMOS Circuits and Technology Meeting (IEEE Cat. No. 03CH37440), Toulouse, France, 2003, pp. 211-214, doi: 10.1109/BIPOL.2003.1274968.

* cited by examiner

*Primary Examiner* — Bilkis Jahan
(74) *Attorney, Agent, or Firm* — Xiaotun Qiu; Frank D. Cimino

(57) ABSTRACT

The present disclosure generally relates to reducing auto-doping in a semiconductor structure. In an example, semiconductor device structure includes a semiconductor substrate, a first epitaxial layer, and a second epitaxial layer. The semiconductor substrate has a first region and a second region. The first region includes a doped layer doped with a first dopant in the semiconductor substrate. The first epitaxial layer is on the doped layer in the first region. The second epitaxial layer is on the first epitaxial layer in the first region and on the semiconductor substrate in the second region.

15 Claims, 19 Drawing Sheets

AUTO-DOPING REDUCTION IN SEMICONDUCTOR STRUCTURE

BACKGROUND

Doping of semiconductor material is ubiquitous in semiconductor processing. Doping a semiconductor material may be implemented to create a p-n junction in the semiconductor material that may form part of a diode, a bipolar junction transistor (BJT), a field effect transistor (FET), or another device. The activated dopant concentration in a given region may affect operation of the device of which the region is a part. For example, activated dopant concentration may affect a threshold voltage, a current through the device, and a resistance through the region, among other things.

SUMMARY

An example described herein is a semiconductor device structure. The semiconductor device structure includes a semiconductor substrate, a first epitaxial layer, and a second epitaxial layer. The semiconductor substrate has a first region and a second region. The first region includes a doped layer doped with a first dopant in the semiconductor substrate. The first epitaxial layer is on the doped layer in the first region. The second epitaxial layer is on the first epitaxial layer in the first region and on the semiconductor substrate in the second region.

An example described herein is a semiconductor device structure. The semiconductor device structure includes a silicon substrate, a silicon cap layer, and a p-type silicon layer. The silicon substrate has a first region and a second region. The silicon substrate includes in the first region a buried layer doped with antimony, arsenic, or a combination thereof. The silicon cap layer is on the silicon substrate over the buried layer in the first region. The p-type silicon layer is on the silicon cap layer in the first region and on the silicon substrate in the second region.

Another example is a method of semiconductor processing. A dopant is implanted in a semiconductor substrate in a first region to form a doped layer. A cap layer is epitaxially grown on the doped layer in the first region. Epitaxially growing the cap layer includes flowing a precursor gas in a chamber in which the semiconductor substrate is disposed. After epitaxially growing the cap layer, the chamber is purged. After purging the chamber, an epitaxial layer is epitaxially grown on the cap layer in the first region and on the semiconductor substrate in a second region. Epitaxially growing the epitaxial layer includes flowing the precursor gas in the chamber.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figures 1, 2:
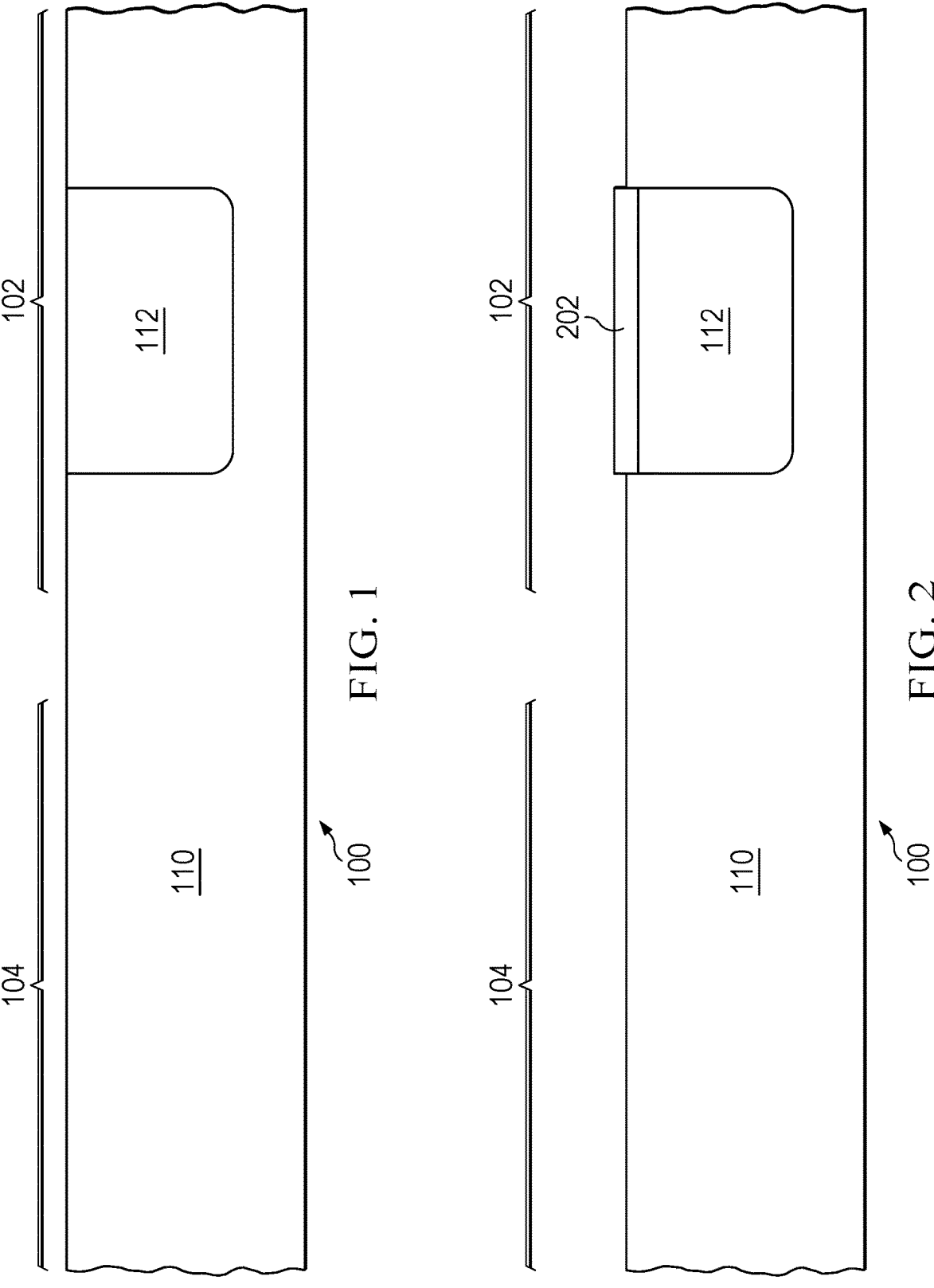
FIGS. 1, 2, and 3 are cross section views of a semiconductor device structure at respective stages of manufacturing in a method to manufacture the semiconductor device structure according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. In the following discussion, doping concentrations may be described in quantitative and/or qualitative terms, wherein a doping concentration less than $1 \times 10^{16}$ $cm^{-3}$ is lightly doped, a doping concentration between $1 \times 10^{16}$ $cm^{-3}$ and $1 \times 10^{18}$ $cm^3$ is moderately doped, a doping concentration between $1 \times 10^{18}$ $cm^{-3}$ and $1 \times 10^{20}$ $cm^3$ is heavily doped, and a doping concentration above $1 \times 10^{20}$ $cm^{-3}$ is very heavily doped. A doping concentration at the boundaries of these ranges may be referred to qualitatively by either term referring to the higher or lower range.

The present disclosure relates to reducing auto-doping in a semiconductor structure. Auto-doping may occur when dopants of a doped region in a semiconductor substrate out-diffuse and are redeposited in a semiconductor material subsequently epitaxially grown on the semiconductor substrate. Auto-doping, in many instances, may be unintentional and difficult to accommodate. Auto-doped regions may have activated dopant concentrations that are unintended and that may not have desirable electrical characteristics.

Various examples described herein may provide a reduction in auto-doping. In some examples, a semiconductor substrate is implanted to form a doped layer, and a cap layer is epitaxially grown on the semiconductor substrate over the doped layer. In other words, the cap layer forms on the implanted region while the un-implanted layer may remain intact. A purge is performed after the cap layer is grown, and an epitaxial layer is subsequently epitaxially grown on the cap layer and on the semiconductor substrate (e.g., the un-implanted layer of the semiconductor substrate). Due to dissimilar characteristics of respective surfaces of the semiconductor substrate on which the cap layer and the epitaxial layer are epitaxially grown, the growth of the cap layer on the surface of the semiconductor substrate through which the dopants of the doped layer were implanted (e.g., a first region) can be performed in a duration less than an incubation time for growth of the epitaxial layer on the surface of the semiconductor substrate through which the dopants of the doped layer were not implanted (e.g., a second region). Hence, the cap layer may be formed (e.g., on the doped layer of the first region) before an epitaxial layer is formed (e.g., on the surface of the second region) on the respective surface of the semiconductor substrate. The purge may remove dopants from the processing environment (e.g., in a chamber of a semiconductor processing tool) in which the epitaxial layer is grown such that auto-doping during the epitaxial growth of the epitaxial layer may be reduced. Various semiconductor device structures may be manufactured in such a manner, and such semiconductor device structures are contemplated within the scope of various examples. Other advantages or benefits may be achieved in various examples.

Some examples described herein relate to auto-doping resulting from dopants implanted in a semiconductor substrate to form an n-type buried layer (NBL). Example n-type dopants may include antimony (Sb), arsenic (As), phosphorus (P), or a combination thereof. Additionally, some examples described herein relate to auto-doping resulting from dopants implanted in a semiconductor substrate to form a p-type buried layer (PBL). Example p-type dopants may include indium (In), boron (B), or a combination thereof. Some examples described herein may incorporate an NBL and a PBL, and auto-doping from both may be reduced according to such examples.

Figure 3:
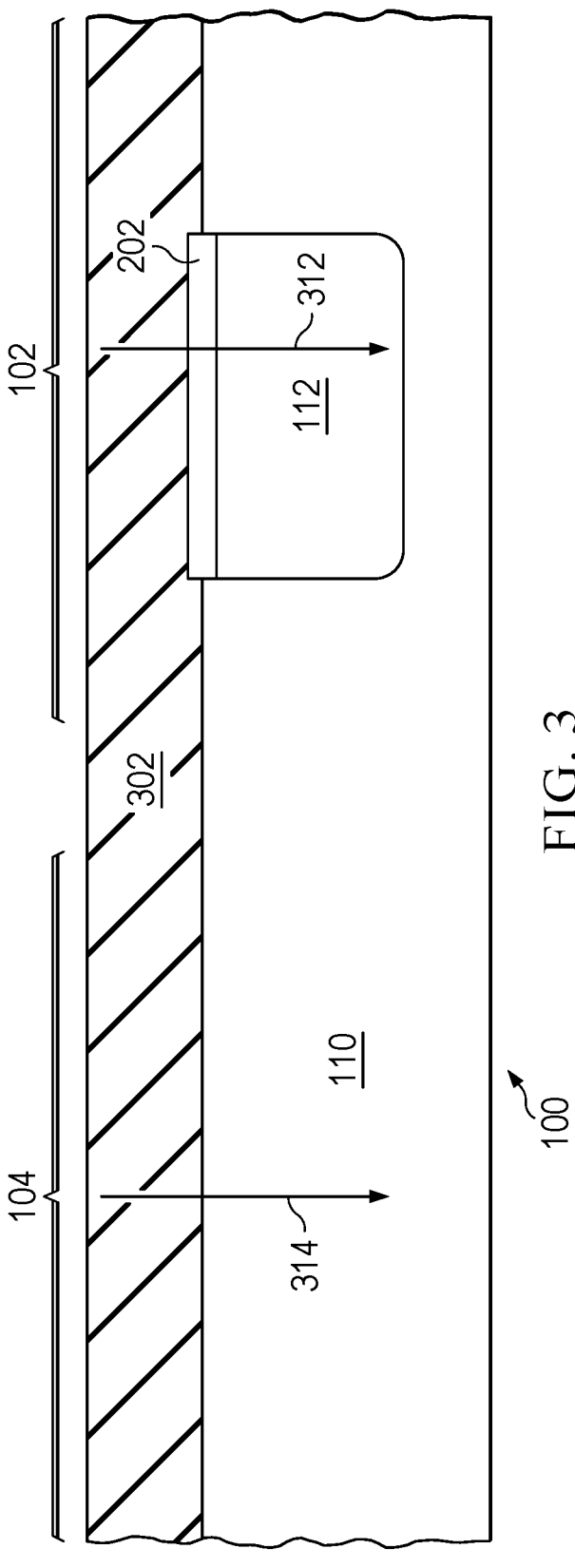

FIGS. 1, 2, and 3 are cross section views of a semiconductor device structure 100 at respective stages of manufacturing in a method to manufacture the semiconductor device structure 100 according to some examples. With reference to FIG. 1, the semiconductor device structure 100 includes a first region 102 and a second region 104 on a semiconductor substrate 110. The semiconductor substrate 110 can be a bulk semiconductor substrate, a semiconductor-on-insulator (SOI) substrate, or any other appropriate substrate. In some examples, the semiconductor substrate 110 is or includes a silicon substrate (which may be singulated from a bulk silicon wafer at the conclusion of semiconductor processing).

A buried layer 112 is formed in the semiconductor substrate 110 in the first region 102. The buried layer 112 is a doped layer in the semiconductor substrate 110. The buried layer 112 may be formed using photolithography and implantation. For example, a photoresist may be deposited (e.g., by spin-on) over the semiconductor substrate 110 and patterned using photolithography. The photoresist is patterned to have an opening corresponding to the area where the buried layer 112 is to be formed. With the patterned photoresist, an implant is performed to implant dopants into the semiconductor substrate 110 thereby forming the buried layer 112. The patterned photoresist may mask areas that are to not be implanted with dopants by the implantation, such as the second region 104. After the implant, the photoresist is removed, such as by ashing.

In some examples, the semiconductor substrate 110 may be doped with a dopant of a first conductivity type, and the buried layer 112 is doped with a dopant of a second conductivity type that may be opposite from the first conductivity type. For example, the semiconductor substrate 110 may be a p-type doped substrate, and the buried layer 112 may be doped by the implantation with an n-type dopant. In some examples, the semiconductor substrate 110 may be p-doped with a p-type dopant at a concentration in a range from about $1\times10^{14}$ cm$^{-3}$ to about $5\times10^{15}$ cm$^{-3}$, e.g., lightly doped. In some examples, the buried layer 112 may be an n-type layer doped with an n-type dopant at a concentration in a range from about $1\times10^{17}$ cm$^{-3}$ to about $2\times10^{20}$ cm$^{-3}$, e.g., moderately to very heavily doped.

In some examples, the semiconductor substrate 110 may be doped with a dopant of a first conductivity type, and the buried layer 112 is doped with a dopant of the first conductivity. For example, the semiconductor substrate 110 may be a p-type doped substrate, and the buried layer 112 may be doped by the implantation with a p-type dopant. In some examples, the semiconductor substrate 110 may be p-doped with a p-type dopant at a concentration in a range from about $1\times10^{14}$ cm$^{-3}$ to about $5\times10^{15}$ cm$^{-3}$, e.g., lightly doped. In some examples, the buried layer 112 may be a p-type layer doped with a p-type dopant at a concentration in a range from about $1\times10^{17}$ cm$^{-3}$ to about $2\times10^{20}$ cm$^{-3}$, e.g., moderately to very heavily doped. Other dopants, conductivity types of dopants, and/or concentrations of dopants may be implemented in the semiconductor substrate 110 and/or the buried layer 112.

More specifically, in some examples, the buried layer 112 is formed by implanting antimony (Sb) and/or arsenic (As) into the semiconductor substrate 110 in the first region 102. In some examples, the buried layer 112 is formed by implanting boron (B) into the semiconductor substrate 110 in the first region 102. Antimony is a relatively heavy dopant and may cause damage to a crystalline structure of the semiconductor substrate 110 when being implanted. Additionally, implantation of dopants, even of smaller size (like boron (B) and arsenic (As)), at certain implantation dosages and to relatively high concentrations in the semiconductor substrate 110 may cause damage to the crystalline structure of the semiconductor substrate 110. The extent of the damage may vary depending on various factors of the implantation, such as energy, dosage, concentration, and duration of the implantation. In some examples, the implantation may amorphize the surface of the semiconductor substrate 110 through which the implantation occurs. Other dopants may realize similar damage to the crystalline structure of the semiconductor substrate 110. In some examples, an annealing process may be performed to at least partially cure the damage to the crystalline structure.

Referring to FIG. 2, a cap layer 202 is formed on the semiconductor substrate 110 in the first region 102 and over the buried layer 112. The cap layer 202, in some examples, is epitaxially grown on the semiconductor substrate 110 as described in more detail herein with reference to FIG. 4. In some examples, the cap layer 202 may be silicon or another semiconductor material.

Referring to FIG. 3, an epitaxial layer 302 is formed on the cap layer 202 in the first region 102 and on the semiconductor substrate 110 in the second region 104 (and further, in any areas in the first region 102 where the cap layer 202 is not formed). The epitaxial layer 302, in some examples, is epitaxially grown on the semiconductor substrate 110 as described in more detail herein with reference to FIG. 4. In some examples, the epitaxial layer 302 may be silicon or another semiconductor material. Further, in some examples, the epitaxial layer 302 is in situ doped (during the epitaxial growth) with a dopant that is the same or different conductivity type of the dopant type of the semiconductor substrate 110. For example, the epitaxial layer 302 may be p-doped in situ with a p-type dopant (e.g., boron) at a concentration in a range from about $1 \times 10^{14}$ cm$^{-3}$ to about $5 \times 10^{15}$ cm$^{-3}$ (such as $1.9 \times 10^{15}$ cm$^{-3}$), e.g., lightly doped.

FIG. 3 further shows a location of a first dopant profile 312 in the first region 102 and a second dopant profile 314 in the second region 104. The first dopant profile 312 extends from a top major surface of the epitaxial layer 302, through the epitaxial layer 302 and the cap layer 202, and into the buried layer 112 in the semiconductor substrate 110. The second dopant profile 314 extends from the top major surface of the epitaxial layer 302, through the epitaxial layer 302, and into the semiconductor substrate 110. As described herein, the first dopant profile 312 and the second dopant profile 314 are each a dopant profile of a concentration of the dopant of the buried layer 112—e.g., the dopant of the buried layer 112 out-diffused from the buried layer 112 and incorporated in areas other than the buried layer 112.

Figure 4:
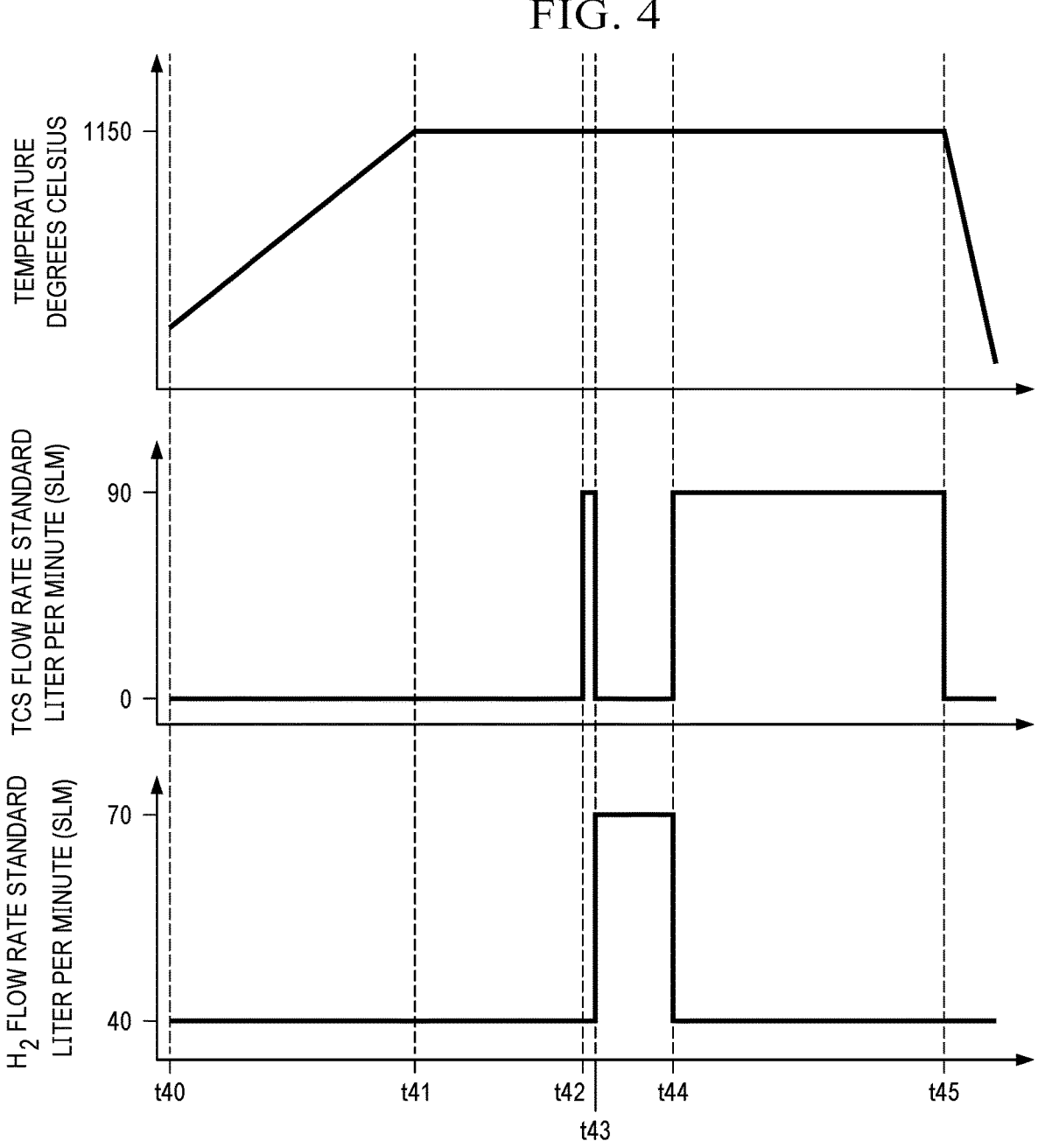
FIG. 4 is a timing diagram of various operations during epitaxial growth of a cap layer and an epitaxial layer according to some examples.

FIG. 4 is a timing diagram of various operations during epitaxial growth of the cap layer 202 and epitaxial layer 302 according to some examples. FIG. 4 shows timing of various temperatures and flow rates of trichlorosilane (TCS) and hydrogen (H$_2$) in a chamber in which the epitaxial growth is performed according to some examples. In this example, the TCS is a precursor gas (e.g., a silicon-containing precursor gas) for epitaxial growth of silicon. Another precursor gas may be implemented in addition to or instead of TCS. In this example, the processing environment in the chamber is maintained at atmospheric pressure. In other examples, processing environment in the chamber may be maintained at another pressure, such as a low pressure, like 100 torr or less.

At an initial time t40 after the semiconductor substrate 110 is loaded into a chamber of a semiconductor processing tool in which the epitaxial growth is to be performed, a temperature of the chamber is ramped up (e.g., increased) to time t41. As illustrated, the temperature is increased to 1150° C.; although in other examples, another temperature may be implemented. Between time t40 and time t41, no TCS is flowed into the chamber, and hydrogen is flowed into the chamber at 40 standard liters per minute (slm).

Between time t41 and time t42, the temperature is maintained (e.g., as illustrated, at 1150° C.) in the chamber. Further, between time t41 and time t42, no TCS is flowed into the chamber, and hydrogen is continued to be flowed into the chamber at 40 slm. The period between time t41 and time t42 may be a bake. During the bake, an oxide (e.g., a native oxide) may be removed from the top surface of the semiconductor substrate 110. The oxide may form as a result of previous processing (such as the ashing that removed the photoresist used to form the buried layer 112) and/or exposure to an oxygen-containing atmosphere during transport. Since an implanted surface of the semiconductor substrate 110 through which dopants were implanted to form the buried layer 112 was exposed throughout the ashing (as opposed to merely at nearing completion of the ashing like the surface of the semiconductor substrate 110 underlying the photoresist), the implanted surface of the semiconductor substrate 110 may have a thicker oxide formed thereon relative to a surface that was underlying the photoresist. Moreover, the presence of dopants in the buried layer 112 may locally enhance oxidation rate.

The oxide may be formed by consuming, e.g., silicon at the respective surface, and a thicker oxide may have consumed relatively more silicon. Hence, the removal of the oxide (e.g., during the bake) may result in a step at the top surface of the semiconductor substrate 110. More specifically, the top surface of the buried layer 112 may be recessed with respect to the top surface of the semiconductor substrate 110 around the buried layer 112 upon completing the bake at time t42. Accordingly, a bottom surface of the cap layer 202 that is subsequently formed may be vertically lower than the top surface of the semiconductor substrate 110 in the second region 104 as shown in FIG. 2. In other words, the bottom surface of the cap layer 202 may be recessed with respect to the top surface of the semiconductor substrate 110 around the cap layer 202. Further, the bake may cure some of the damage to the crystalline structure of the semiconductor substrate 110 that resulted from the implantation of the dopant that formed the buried layer 112. In some examples, the damage of the crystalline structure is not fully cured to the original crystalline structure before the implantation.

Between time t42 and time t43, flow of TCS (e.g., a precursor gas, and more specifically, a silicon-containing precursor gas) into the chamber begins and is maintained throughout the period. In the illustrated example, at time t42, a flow rate of TCS is initiated to 90 slm and is maintained at 90 slm from time t42 to time t43. The temperature of the chamber and the flow rate of hydrogen into the chamber are maintained from the preceding period between time t42 and time t43.

During the period between time t42 and time t43, the cap layer 202 is epitaxially grown on the semiconductor substrate 110 while the semiconductor substrate 110 is in the chamber. The duration of the period between time t42 and time t43 (e.g., inclusively of the time that TCS is flowing) may be based on an incubation time of epitaxial growth nucleating and beginning on a surface of the semiconductor substrate 110 through which dopants of the buried layer 112 were not implanted (e.g., in the second region 104).

Figure 5:
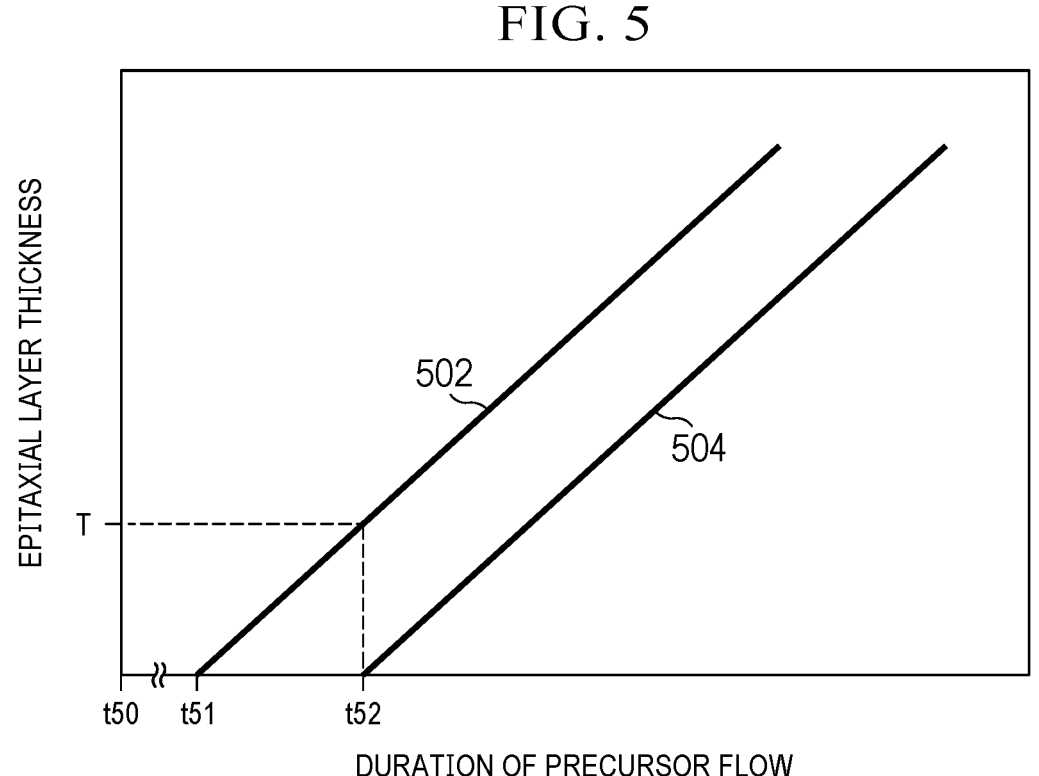
FIG. 5 is a graph illustrating thickness of an epitaxial layer as a function of duration of a precursor flow according to some examples.

FIG. 5 illustrates this incubation time according to some examples. FIG. 5 is a graph illustrating thickness of an epitaxial layer as a function of duration of a precursor flow. A thickness function 502 is the thickness as a function of time of an epitaxial layer epitaxially grown on the surface of the semiconductor substrate 110 through which dopants of the buried layer 112 were implanted. A thickness function 504 is the thickness as a function of time of an epitaxial layer epitaxially grown on a surface of the semiconductor substrate 110 through which dopants of the buried layer 112 were not implanted. The flow of the precursor (e.g., TCS with reference to FIG. 4) begins at time t50 (e.g., time t42 in FIG. 4). An incubation time may occur between time t50 and time t51 before growth of the epitaxial layer corresponding to the thickness function 502 begins. An incubation time may occur between time t50 and time t52 before growth of the epitaxial layer corresponding to the thickness function 504 begins.

Referring to both FIGS. 4 and 5, the duration of the period between time t42 and time t43 does not exceed the incubation time (e.g., from time t50 to time t52) of an epitaxial layer epitaxially grown on a surface of the semiconductor substrate 110 through which dopants of the buried layer 112 were not implanted. Accordingly, in some examples, the thickness of the cap layer 202 does not exceed the thickness T (shown in FIG. 5) corresponding to the time t52 at which growth of an epitaxial layer on a surface of the semiconductor substrate 110 through which dopants of the buried layer 112 were not implanted begins. In some examples, the thickness of the cap layer 202 is 0.15 μm or less, which may correspond to a duration between time t42 and time t43 of 3 seconds or less. In some examples, the thickness of the cap layer 202 is 0.10 μm or less, which may correspond to a duration between time t42 and time t43 of 2 seconds or less. In some examples, the thickness of the cap layer 202 is 0.05 μm or less, which may correspond to a duration between time t42 and time t43 of 1 second or less.

Referring to FIG. 4, at time t43, flow of TCS (e.g., a precursor gas, and more specifically, a silicon-containing precursor gas) into the chamber ceases, and flow of hydrogen increases. The flow of hydrogen is then maintained throughout the period from time t43 to time t44. In the illustrated example, at time t43, a flow rate of hydrogen is increased to 70 slm and is maintained at 70 slm from time t43 to time t44. The temperature of the chamber is maintained between time t43 and time t44 from the preceding period.

The period between time t43 and time t44 may be a purge of the chamber. The purge may remove from the processing environment of the chamber dopants (e.g., antimony) that may have out-diffused from the semiconductor substrate 110 and present in the processing environment of the chamber during the epitaxial growth of the cap layer 202. By purging the chamber and removing the dopants from the processing environment of the chamber, the amount of the dopants that may be incorporated (or re-deposited) in the epitaxial layer 302 during subsequent epitaxial growth may be reduced. Further, the cap layer 202 may form a buffer between the buried layer 112 and the processing environment of the chamber for the subsequent epitaxial growth. The cap layer 202 may therefore reduce an amount of out-diffusing of dopants from the buried layer 112 into the processing environment of the chamber during the subsequent epitaxial growth. The doping of the epitaxial layer 302 by dopants out-diffused from the buried layer 112 may be referred to as auto-doping, and hence, in some examples, auto-doping of the epitaxial layer 302 (by dopants out-diffused from the buried layer 112) may be reduced.

Between time t44 and time t45, flow of TCS (e.g., a precursor gas, and more specifically, a silicon-containing precursor gas) into the chamber begins and is maintained throughout the period. Additionally, between time t44 and time t45, flow of hydrogen into the chamber is reduced and is maintained throughout the period. In the illustrated example, at time t44, a flow rate of TCS is initiated to 90 slm and is maintained at 90 slm from time t44 to time t45. Further, at time t44, a flow rate of hydrogen is reduced to 40 slm and is maintained at 40 slm from time t44 to time t45. The temperature of the chamber is maintained between time t44 and time t45 from the preceding period. During the period between time t44 and time t45, the epitaxial layer 302 is epitaxially grown on the cap layer 202 (e.g., in the first region 102) and on the semiconductor substrate 110 (e.g., in the second region 104) while the semiconductor substrate 110 is in the chamber. Although not shown, a dopant-source gas may be flowed during the period between time t44 and time t45 to in situ dope the epitaxial layer 302. For example, when the epitaxial layer 302 is in situ doped with a p-type dopant, the dopant-source gas may be or include diborane ($B_2H_6$) or the like.

At time t45, flow of TCS (e.g., a precursor gas, and more specifically, a silicon-containing precursor gas) into the chamber ceases, and the temperature of the chamber is decreased. Thereafter, the processing in the chamber may cease, and the semiconductor substrate 110 may be removed from the chamber.

TABLE 1

| Table 1 below lists various durations and thicknesses according to some examples. | | | | |
|---|---|---|---|---|
| Growth duration t42-t43 (seconds) | Cap layer 202 thickness (μm) | Purge duration t43-t44 (seconds) | Growth duration t44-t45 (seconds) | Epitaxial layer 302 thickness (μm) |
| 1 | 0.05 | 20 | 69 | 3.45 |
| 2 | 0.10 | 20 | 68 | 3.40 |
| 3 | 0.15 | 20 | 67 | 3.35 |

The processing illustrated by FIG. 4 is merely an example. A different precursor(s) may be used for epitaxial growth. For example, dichlorosilane (DCS) may be used as a silicon-containing precursor gas. In some examples, DCS at a low pressure may suppress auto-doping of an n-type dopant (e.g., antimony) but may enhance auto-doping of a p-type dopant. Other materials may be epitaxially grown. The cap layer 202 may be a same or different material as the epitaxial layer 302. The duration of various periods may vary, and the temperature of the chamber during any of the various periods may vary. Further, another carrier and/or inert gas may be implemented instead of or in addition to hydrogen gas. Various other modifications may be made.

Figure 6:
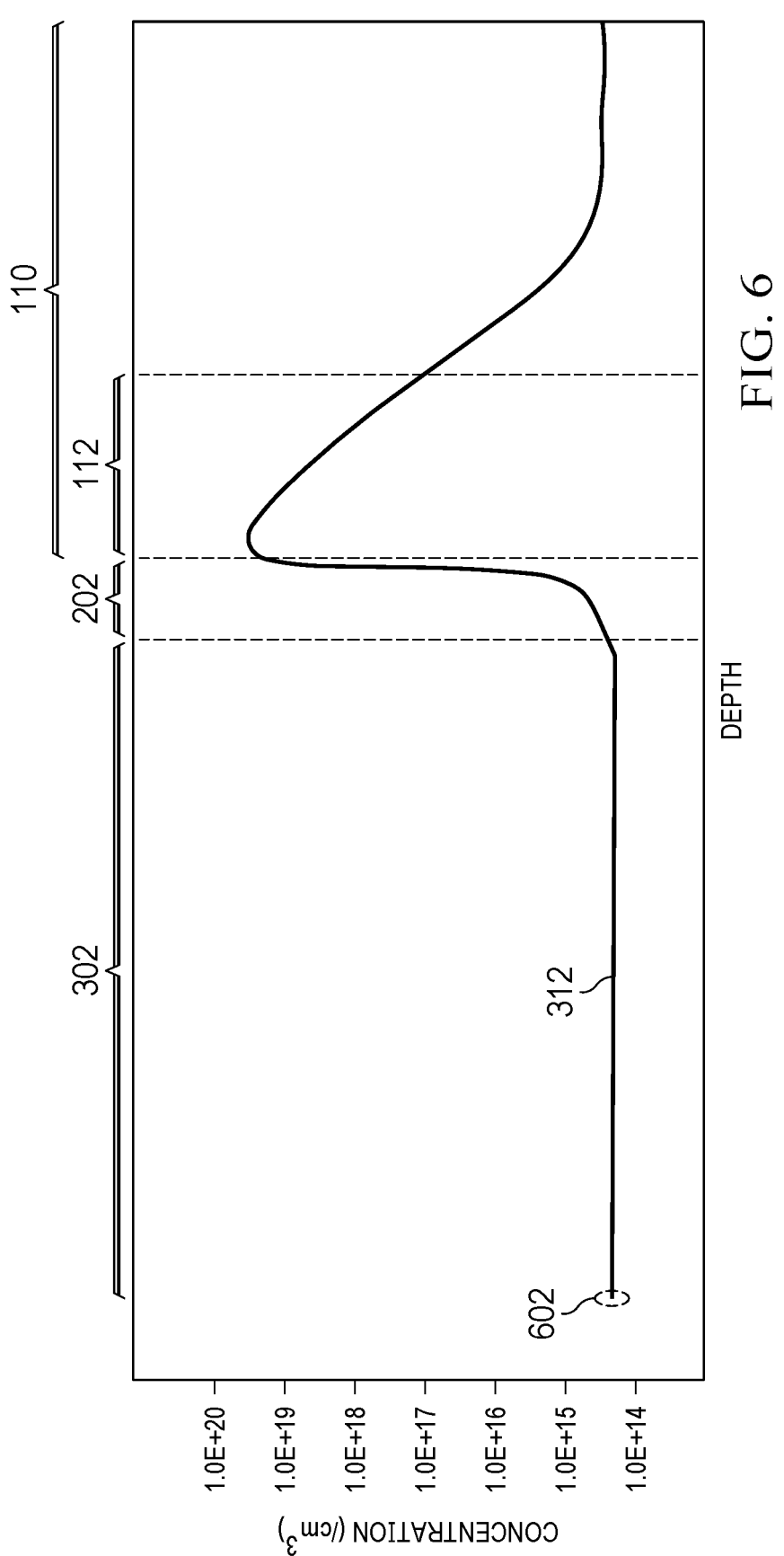
FIG. 6 is a graph illustrating a first dopant profile according to some examples.

FIG. 6 is a graph illustrating the first dopant profile 312 according to some examples. As stated previously, the first dopant profile 312 is in the first region 102 as shown in FIG. 3 and is a dopant profile of a concentration of the dopant (e.g., antimony (Sb), arsenic (As), or boron (B)) of the buried layer 112 or originated from the buried layer 112. From the top surface of the epitaxial layer 302 to the interface between the epitaxial layer 302 and the cap layer 202, the concentration of the dopant is low or not detectable with a desired degree of confidence (e.g., at or below a lower detection limit of equipment, such as dynamic secondary ion mass spectrometry (DSIMS) equipment, used to detect the dopant). From the interface between the epitaxial layer 302 and the cap layer 202, the concentration of the dopant increases with a curve approximating exponential growth to the interface between the cap layer 202 and the semiconductor substrate 110. From the interface between the cap layer 202 and the semiconductor substrate 110, the concentration of the dopant increases to a peak concentration (e.g., in the buried layer 112) and then decreases as the depth into the semiconductor substrate 110 increases.

In the illustrated example of the first dopant profile 312, the concentration of the dopant in the epitaxial layer 302 is equal to or less than a lower detection limit, such as $3 \times 10^{14}$ $cm^{-3}$—e.g., a fictitious concentration that may correspond to a noise level of the DSIMS equipment. In some examples, the concentration of the dopant in the epitaxial layer 302 may be less than $1 \times 10^{14}$ $cm^{-3}$. Within the cap layer 202, the concentration increases from the lower detection limit at the interface with the epitaxial layer 302 to approximately $1 \times 10^{19}$ $cm^{-3}$ at the interface with the semiconductor substrate 110. In the semiconductor substrate 110, the concentration peaks at approximately $3 \times 10^{19}$ $cm^{-3}$ (e.g., in the buried layer 112) and subsequently decreases as the depth into the semiconductor substrate 110 increases.

By performing a purge as described above with respect to FIG. 4, the auto-doping of the cap layer 202 may have been reduced—e.g., at locations within the cap layer 202 away from the interface with the semiconductor substrate 110. For example, with at least some of the dopant being removed from the processing environment of the chamber, less dopant is available to diffuse from that processing environment back into the cap layer 202 during subsequent epitaxial growth. Additionally, the auto-doping of the epitaxial layer 302 in the first region 102, may be reduced. For example, with at least some of the dopant being removed from the processing environment of the chamber, less dopant is available to be redeposited (included or incorporated) in the epitaxial layer 302 during epitaxial growth of the epitaxial layer 302.

Figure 7:
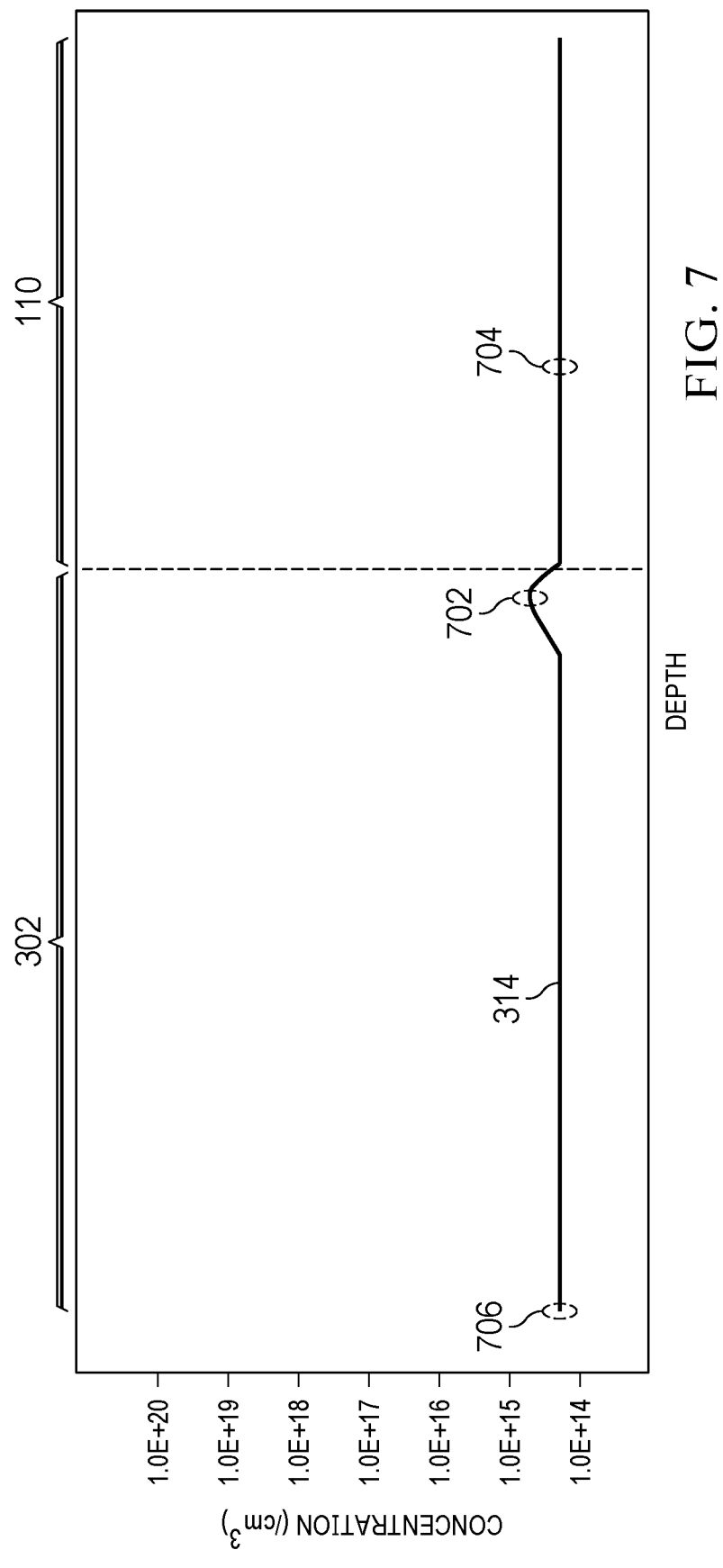
FIG. 7 is a graph illustrating a second dopant profile according to some examples.

FIG. 7 is a graph illustrating the second dopant profile 314 according to some examples. As stated previously, the second dopant profile 314 is in the second region 104 as shown in FIG. 3 and is a dopant profile of a concentration of the dopant (e.g., antimony (Sb), arsenic (As), or boron (B)) of the buried layer 112—e.g., the dopants out-diffused from the buried layer 112 and redeposited (included or incorporated) in the second region. From the top surface of the epitaxial layer 302 to a depth proximate the interface between the epitaxial layer 302 and the semiconductor substrate 110, the concentration of the dopant is low or not detectable with a desired degree of confidence (e.g., at or below a lower detection limit of DSIMS equipment). Within a region of the epitaxial layer 302 proximate the interface between the epitaxial layer 302 and the semiconductor substrate 110, the concentration increases to a peak concentration 702 and then decreases from the peak concentration 702 to the interface between the epitaxial layer 302 and the semiconductor substrate 110. From the interface between the epitaxial layer 302 and the semiconductor substrate 110, the concentration of the dopant decreases to or is equal to a concentration that is low or not detectable with a desired degree of confidence as the depth into the semiconductor substrate 110 increases.

In the illustrated example of the second dopant profile 314, the concentration of the dopant is equal to or less than a lower detection limit, such as $3 \times 10^{14}$ cm$^{-3}$ (e.g., a fictitious concentration that may correspond to a noise level of the DSIMS equipment), and in some examples, less than $1 \times 10^{14}$ cm$^{-3}$, in the epitaxial layer 302 from the top surface to the region proximate the semiconductor substrate 110. In the region proximate the semiconductor substrate 110, the concentration increases to approximately $8 \times 10^{14}$ cm$^{-3}$ (e.g., less than $1 \times 10^{15}$ cm$^{-3}$) at the peak concentration 702 and subsequently decreases. At the interface between the epitaxial layer 302 and the semiconductor substrate 110 and into the semiconductor substrate 110, the concentration of the dopant becomes equal to or less than the lower detection limit.

By performing a purge (and forming the cap layer) as described above with respect to FIG. 4, the auto-doping of the epitaxial layer 302, particularly in the second region 104, may have been reduced—e.g., in the region proximate the semiconductor substrate 110. For example, with at least some of the dopant being removed from the processing environment of the chamber, less dopant is available to be redeposited (included or incorporated) in the epitaxial layer 302 during epitaxial growth of the epitaxial layer 302. In other words, the peak concentration 702 in the second region 104 may have been reduced—e.g., by performing a purge (and forming a cap layer) as described herein. In some examples, the peak concentration 702 is equal to or less than $1 \times 10^{15}$ cm$^{-3}$.

In the following paragraphs, a generalized description of the reduced auto-doping is provided in accordance with the method including operations described with reference to FIG. 4. The reduced auto-doping may be manifested as dopant concentration (e.g., Sb or B of the buried layer 112) present (or detected) at or near (proximate) the interface between the epitaxial layer 302 and the semiconductor substrate 110—e.g., the peak concentration 702. A dopant concentration may be represented in the notation $c \times 10^m$ cm$^{-3}$, where c is greater than or equal to one and less than 10 (e.g., $1 \le c < 10$) and m is an integer.

Where a concentration $c \times 10^m$ cm$^{-3}$ of the dopant is detectable (e.g., a dopant concentration of $4 \times 10^{14}$ cm$^{-3}$ that is greater than a lower detection limit of $3 \times 10^{14}$ cm$^{-3}$) in some comparative regions (e.g., locations where concentration 704 or 706 are indicated in the second dopant profile 314), the peak concentration 702 of the dopant may be less than $5 \times 10^m$ cm$^{-3}$ plus the concentration $c \times 10^m$ cm$^{-3}$—e.g., $5 \times 10^{14}$ cm$^{-3}$+$4 \times 10^{14}$ cm$^{-3}$ corresponding to $9 \times 10^{14}$ cm$^{-3}$ as a result of utilizing the method described herein. In other words, the dopant's presence at the peak concentration 702 resulting from the reduced auto-doping may be equal to or less than $5 \times 10^m$ cm$^{-3}$ (e.g., by performing a purge (and forming a cap layer) as described herein) such that a total peak concentration 702 may amount to $(c+5) \times 10^m$ cm$^{-3}$ (e.g., $9 \times 10^{14}$ cm$^{-3}$).

Where a concentration $c \times 10^m$ cm$^{-3}$ of the dopant is at or below a lower detection limit in some comparative region (e.g., locations where concentration 704 or 706 are indicated in the second dopant profile 314), the peak concentration 702 of the dopant at or near (proximate) the interface between the epitaxial layer 302 and the semiconductor substrate 110 may be less than $5 \times 10^m$ cm$^{-3}$ plus the lower detection limit concentration. In one example where the lower detection limit is $3 \times 10^{14}$ cm$^{-3}$, the peak concentration 702 of the dopant may be less than $8 \times 10^{14}$ cm$^{-3}$—i.e., $(5+3) \times 10^{14}$ cm$^{-3}$. In another example where the lower detection limit is $1 \times 10^{14}$ cm$^{-3}$, the peak concentration 702 of the dopant may be less than $6 \times 10^{14}$ cm$^{-3}$—i.e., $(5+1) \times 10^{14}$ cm$^{-3}$. When the concentration of the dopant is at or below the lower detection limit, the concentration may be anywhere from negligible to the lower detection limit. In such situations, the concentration of the dopant may be assumed to be the lower detection limit. Hence, in such examples, the peak concentration 702 may be less than $8 \times 10^{14}$ cm$^{-3}$ (where the lower detection limit is $3 \times 10^{14}$ cm$^{-3}$) or $6 \times 10^{14}$ cm$^{-3}$ (where the lower detection limit is $1 \times 10^{14}$ cm$^{-3}$) in view of the dopant's presence at the peak concentration 702 resulting from the reduced auto-doping to be equal to or less than $5 \times 10^m$ cm$^{-3}$ (e.g., $5 \times 10^{14}$ cm$^{-3}$)—e.g., by performing a purge (and forming a cap layer) as described herein.

In some examples, the comparative region is a region (e.g., a region including a location where concentration 704 is indicated in the second dopant profile 314) in the semiconductor substrate 110 in the second region 104 at a depth in the semiconductor substrate 110 that corresponds with a lower depth of the buried layer 112. This comparative region has a concentration 704, i.e., $c \times 10^m$ cm$^{-3}$ of the dopant concentration. In such examples, the peak concentration 702 may be equal to or less than the greater of: (i) the sum of the concentration 704 ($c \times 10^m$ cm$^{-3}$) and $5 \times 10^m$ cm$^{-3}$ (e.g., $(c+5) \times 10^m$ cm$^{-3}$) and (ii) $8 \times 10^{14}$ cm$^{-3}$ when the concentration 704 is below a lower detection limit of $3 \times 10^{14}$ cm$^{-3}$ (or $6 \times 10^{14}$ cm$^{-3}$ when the concentration 704 is below a lower detection limit of $1 \times 10^{14}$ cm$^{-3}$).

In some examples, the comparative region is (i) a region (e.g., a region including a location where concentration 706 is indicated in the second dopant profile 314) in the second region 104, in the epitaxial layer 302 distal from the interface between the epitaxial layer 302 and the semiconductor substrate 110 or (ii) a region (e.g., a region including a location where concentration 602 is indicated in the first dopant profile 312) in the first region 102, in the epitaxial layer 302 distal from the interface between the epitaxial layer 302 and the cap layer 202. In such examples, the peak concentration 702 may be equal to or less than the greater of: (i) the sum of the concentration 706 or 602 ($c \times 10^m$ $cm^{-3}$) and $5 \times 10^m$ $cm^{-3}$ (e.g., $(c+5) \times 10^m$ $cm^{-3}$) and (ii) $8 \times 10^{14}$ $cm^{-3}$ when the concentration 706 or 602 is below a lower detection limit of $3 \times 10^{14}$ $cm^{-3}$ (or $6 \times 10^{14}$ $cm^{-3}$ when the concentration 706 or 602 is below a lower detection limit of $1 \times 10^{14}$ $cm^{-3}$).

Figure 8:
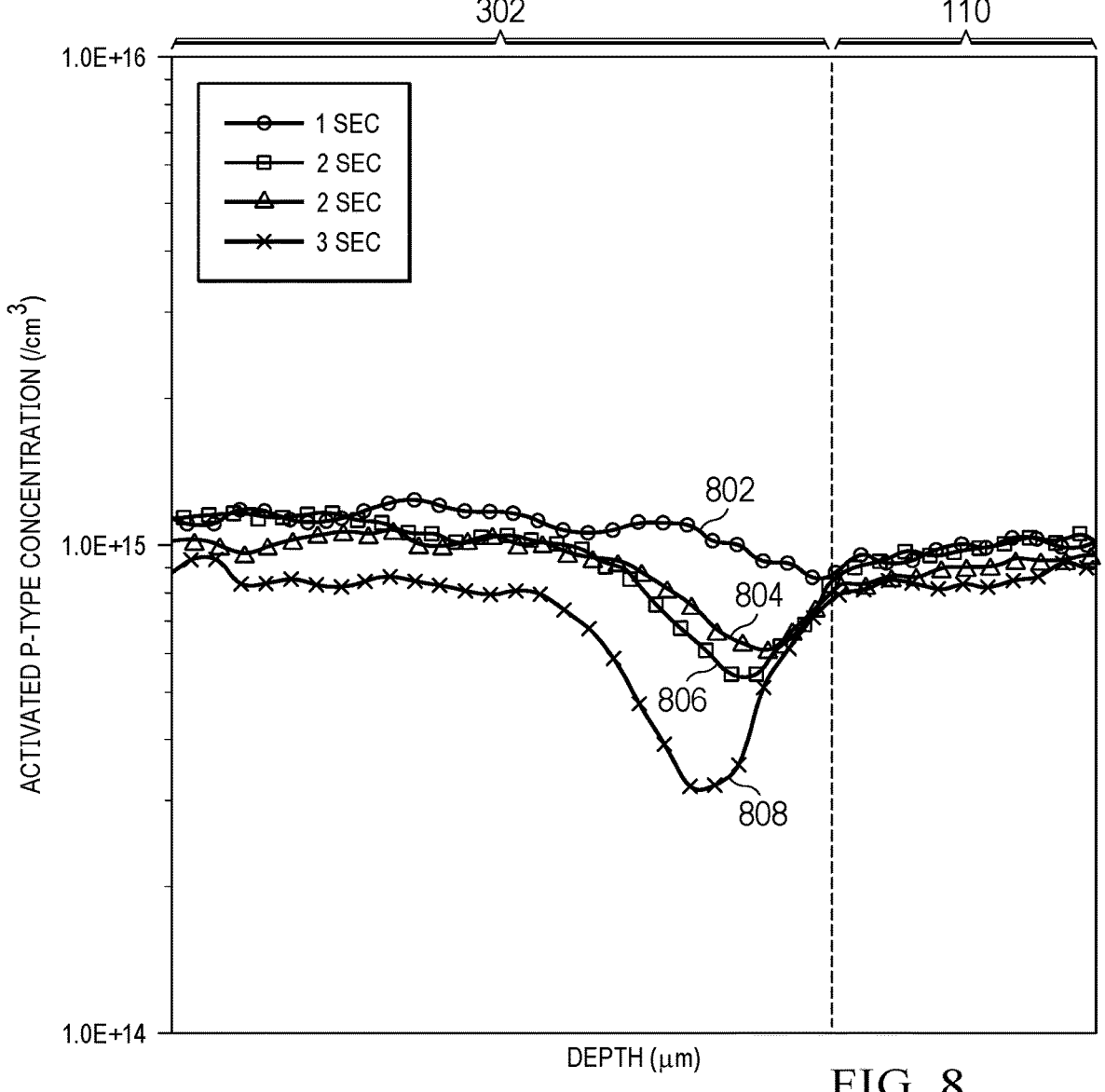
FIG. 8 is a graph illustrating activated p-type dopant concentrations according to various examples.
Figure 9A:
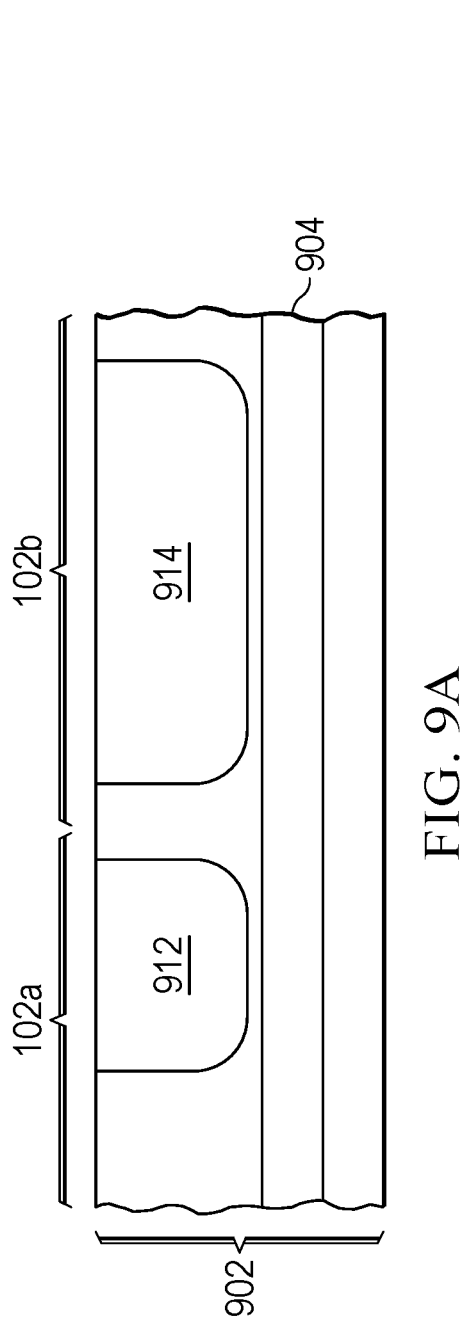
FIGS. 9A, 9B, 9C, 9D, 10A, 10B, 10C, 10D, 11A, 11B, 11C, and 11D are cross section views of semiconductor device structures during stages of manufacturing the semiconductor device structures according to some examples.
Figure 9B:
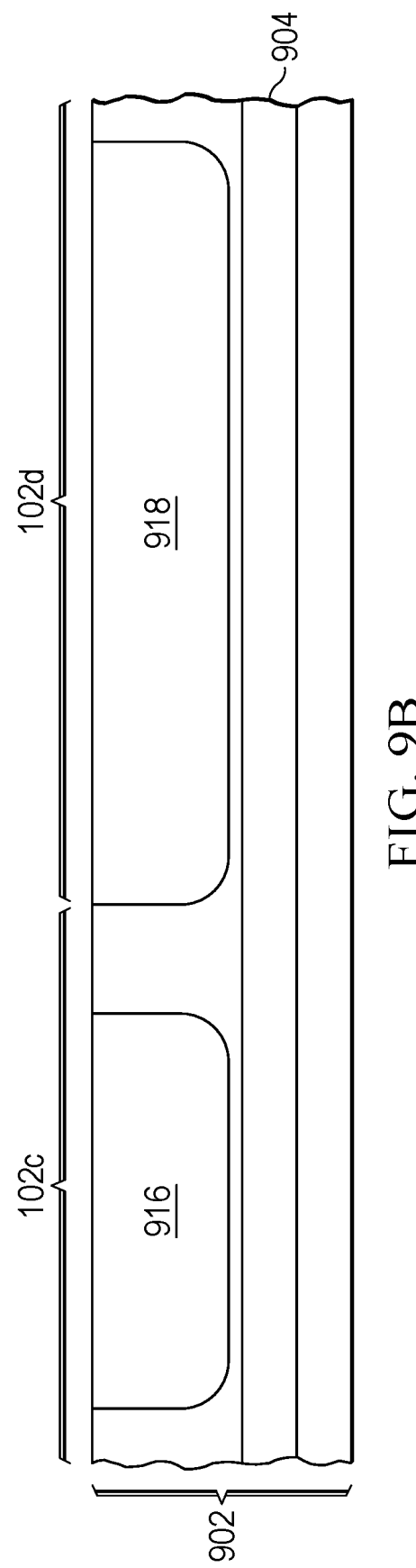
Figures 9C, 9D:
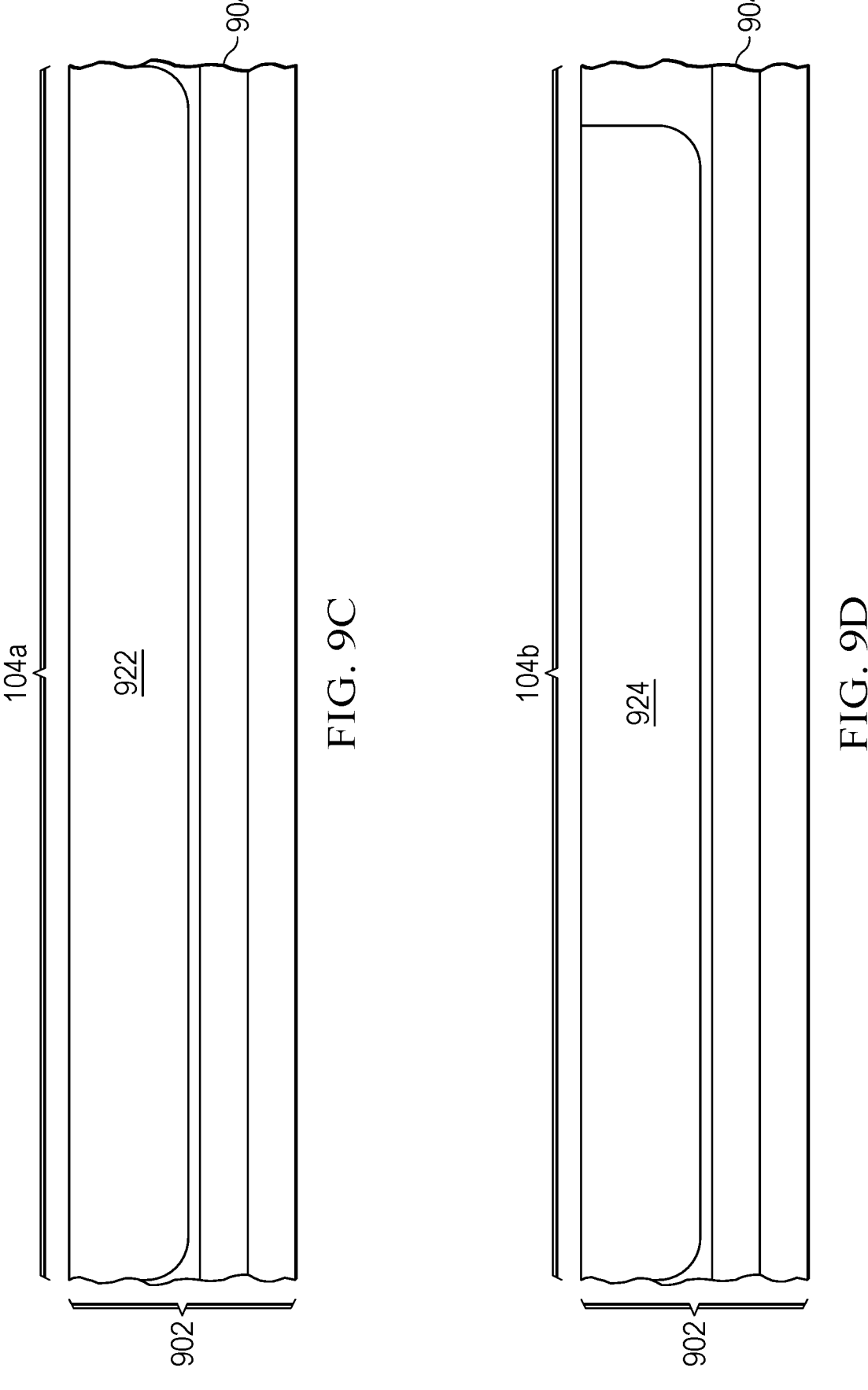
Figure 10A:
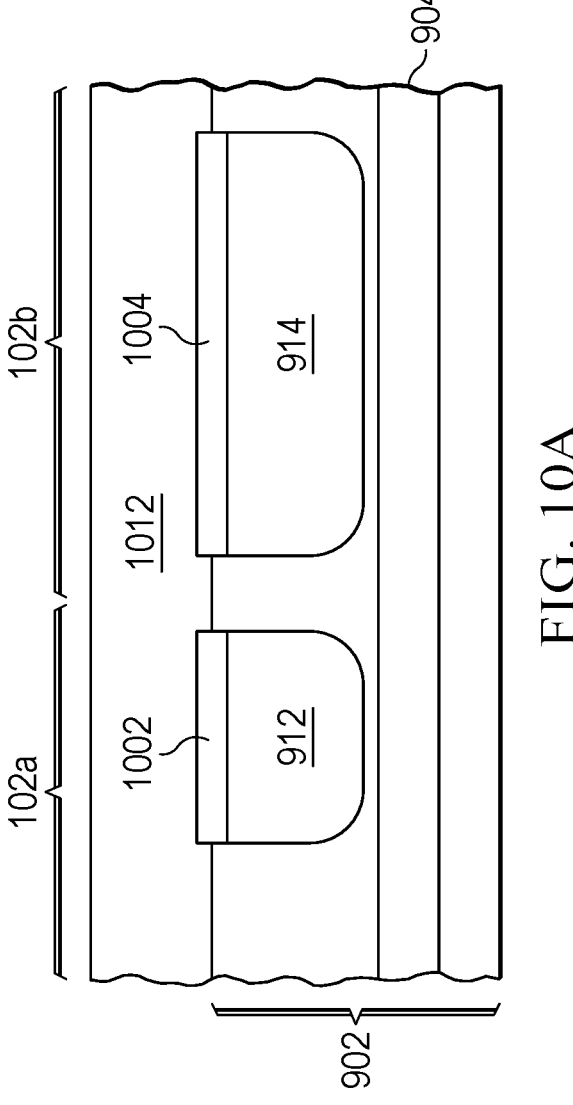
Figure 10B:
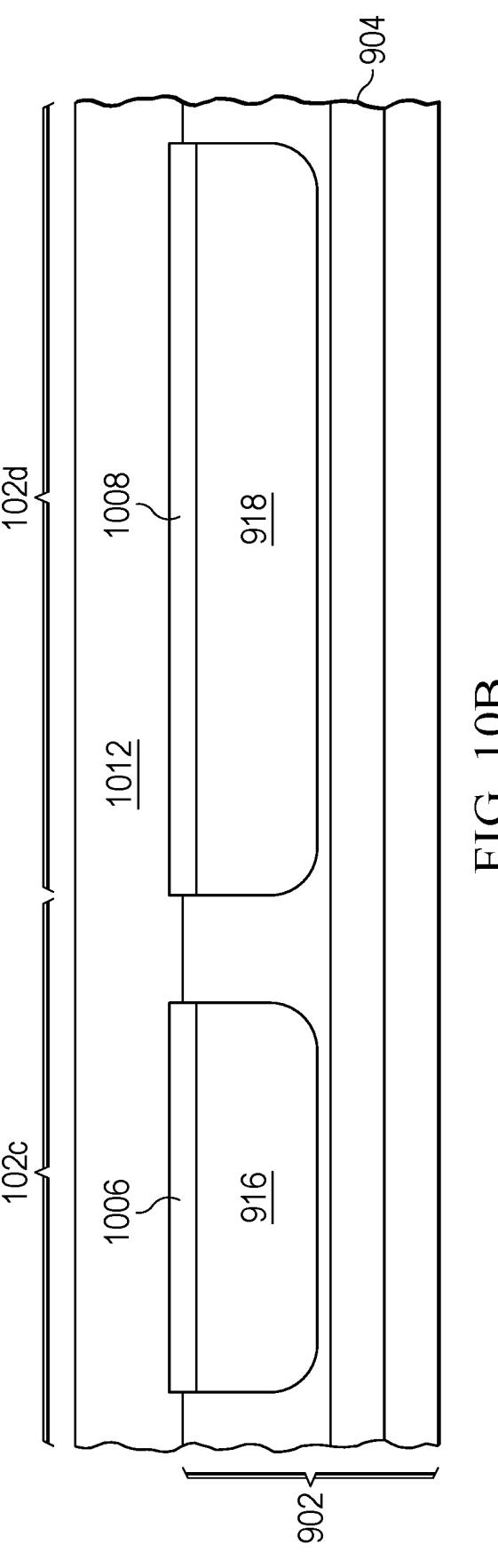
Figure 10C:
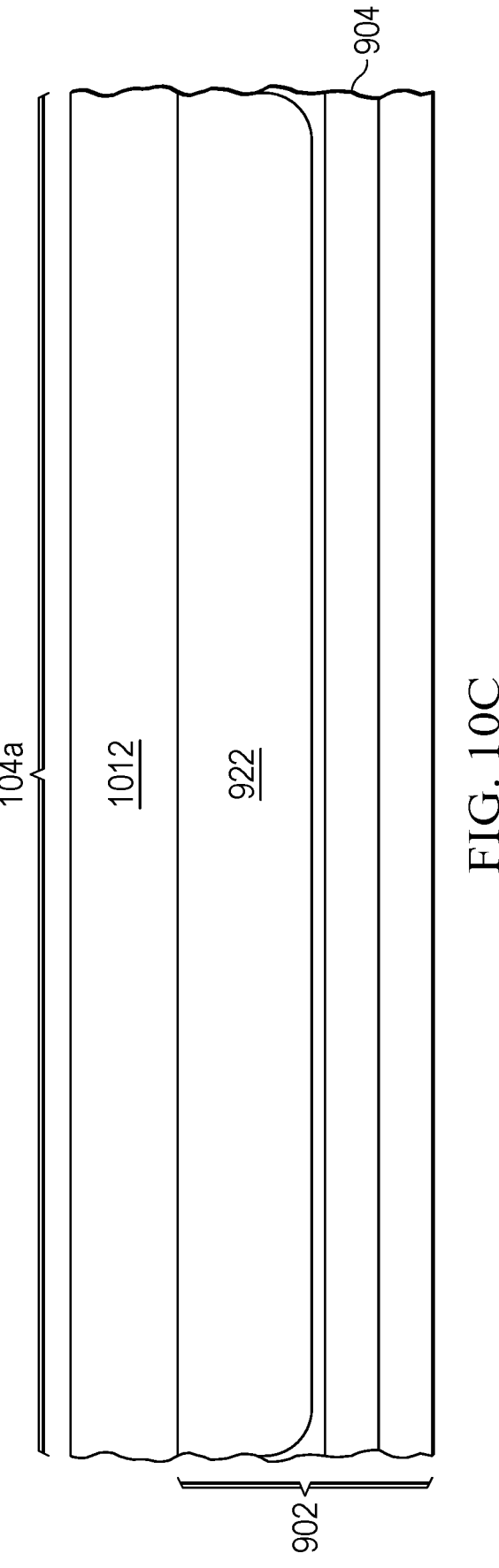
Figure 10D:
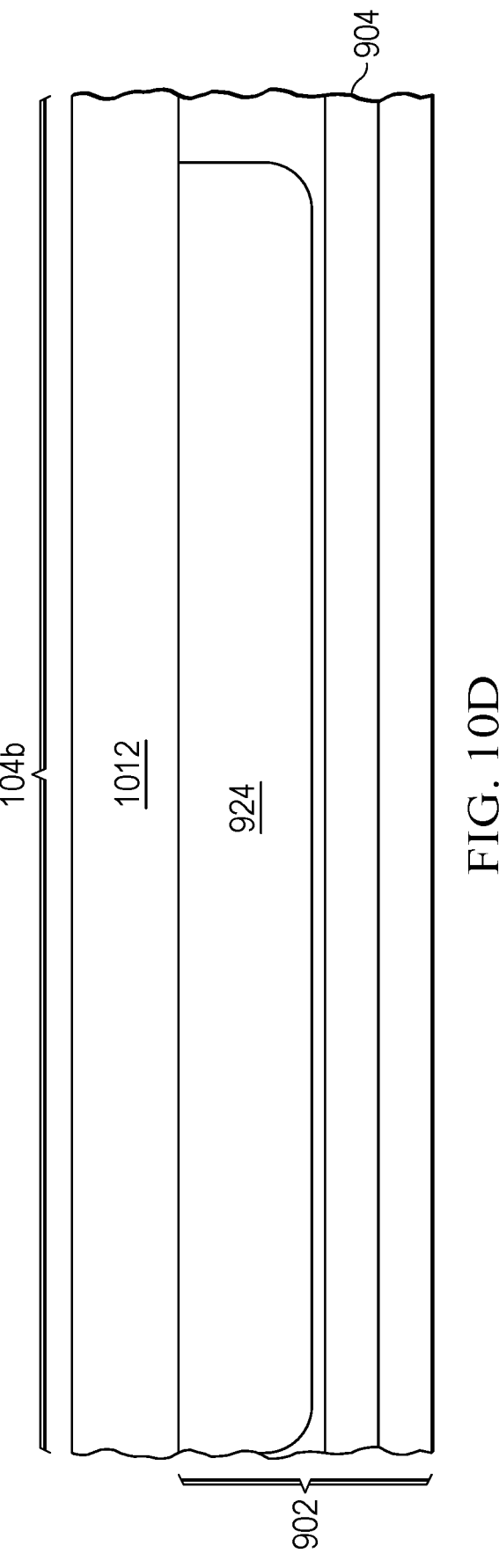
Figure 11A:
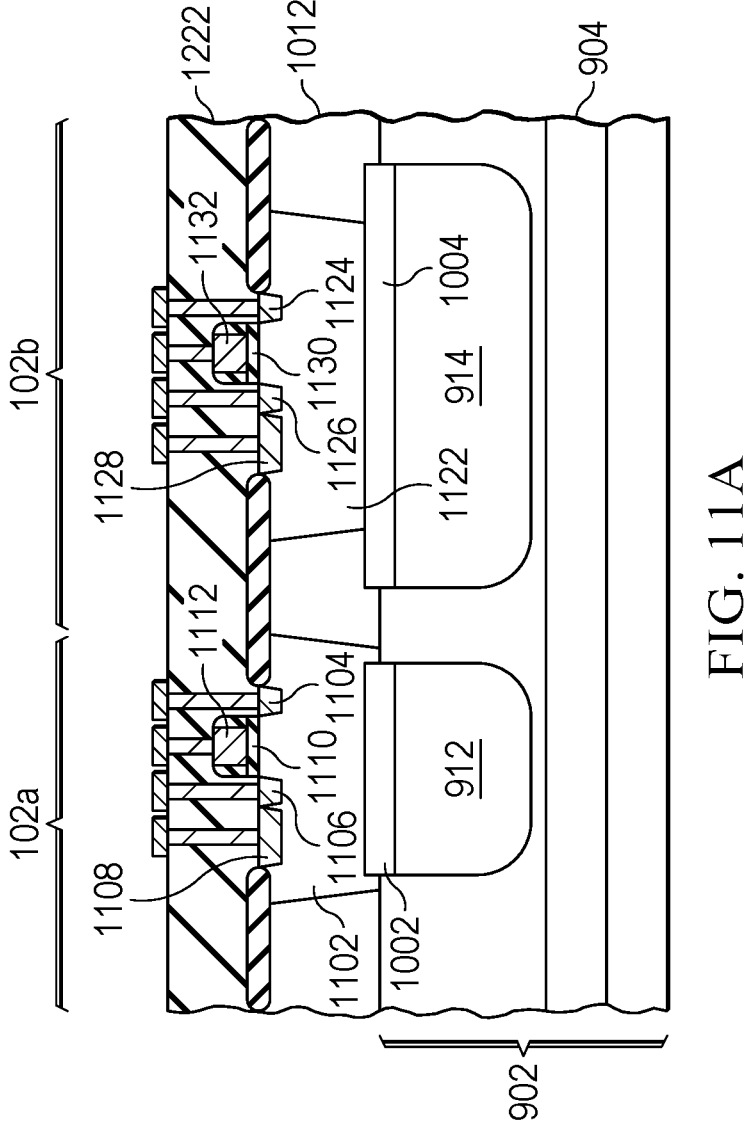
Figure 11B:
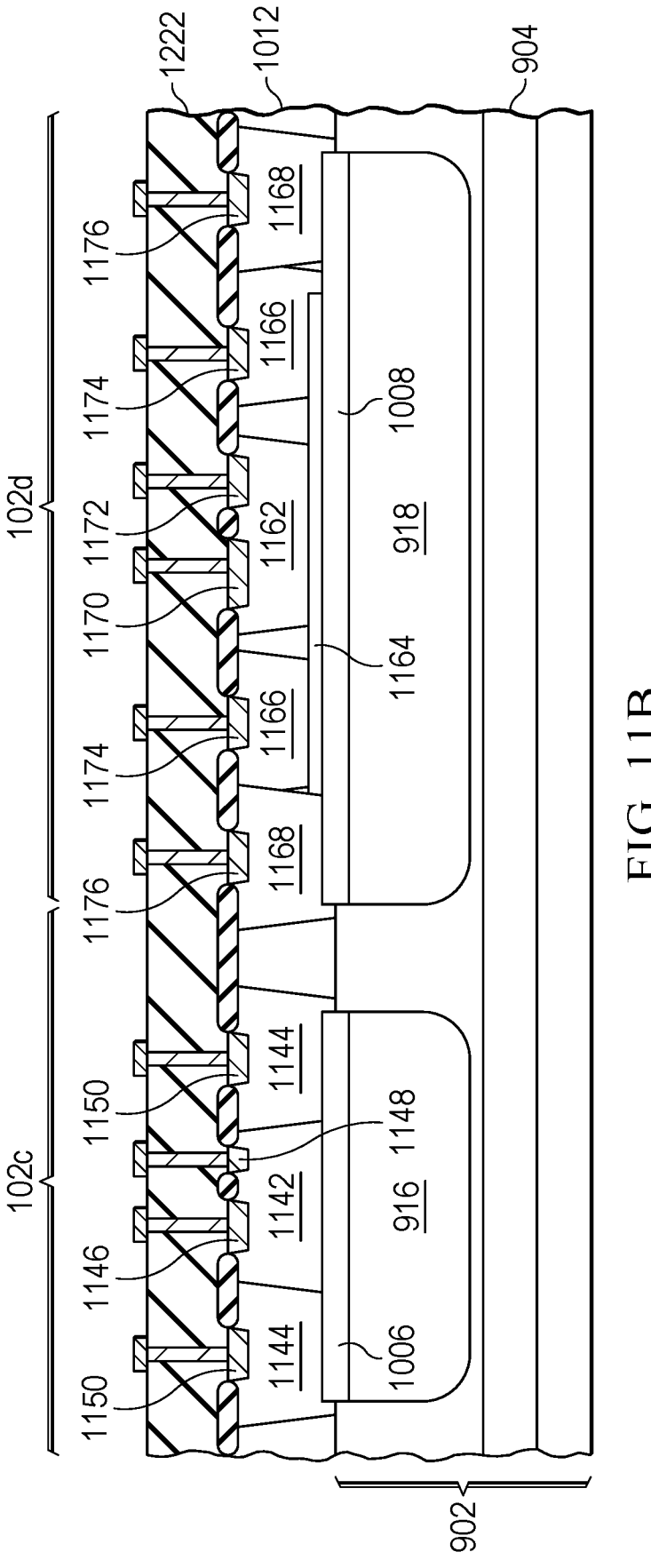
Figure 11C:
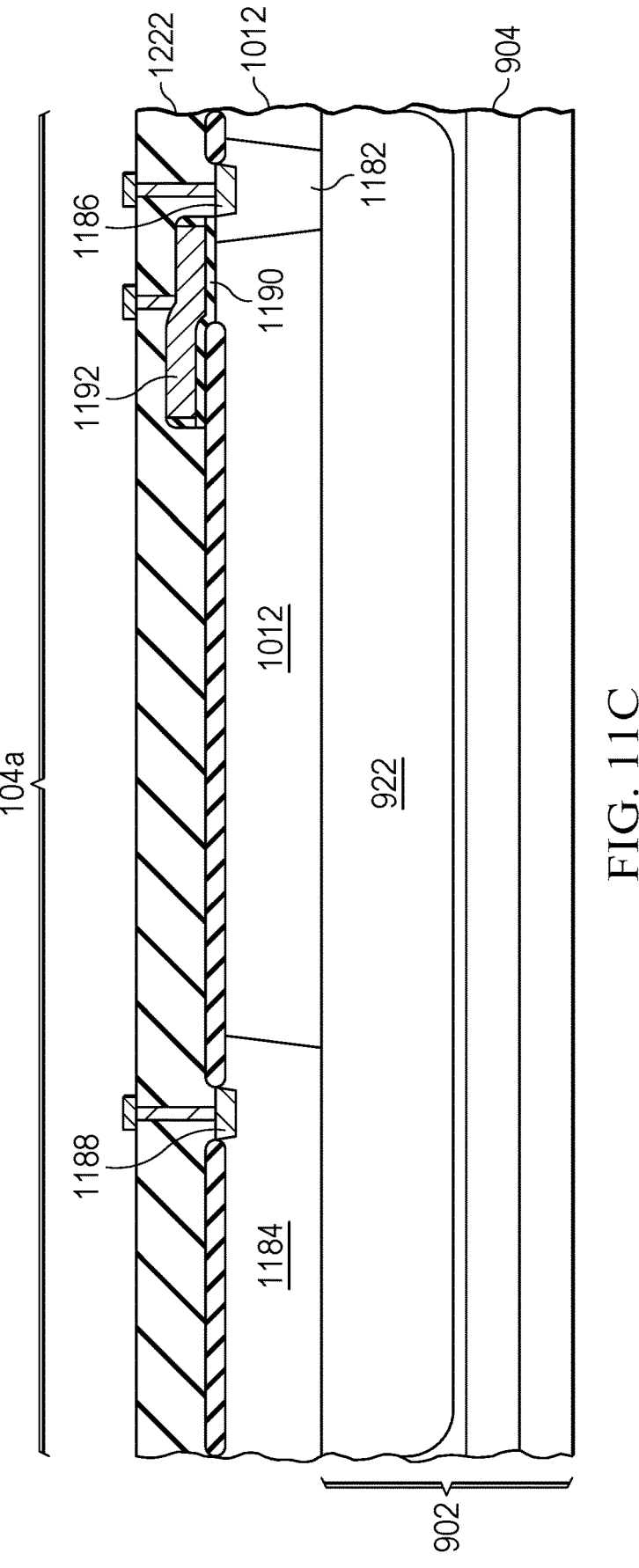
Figure 11D:
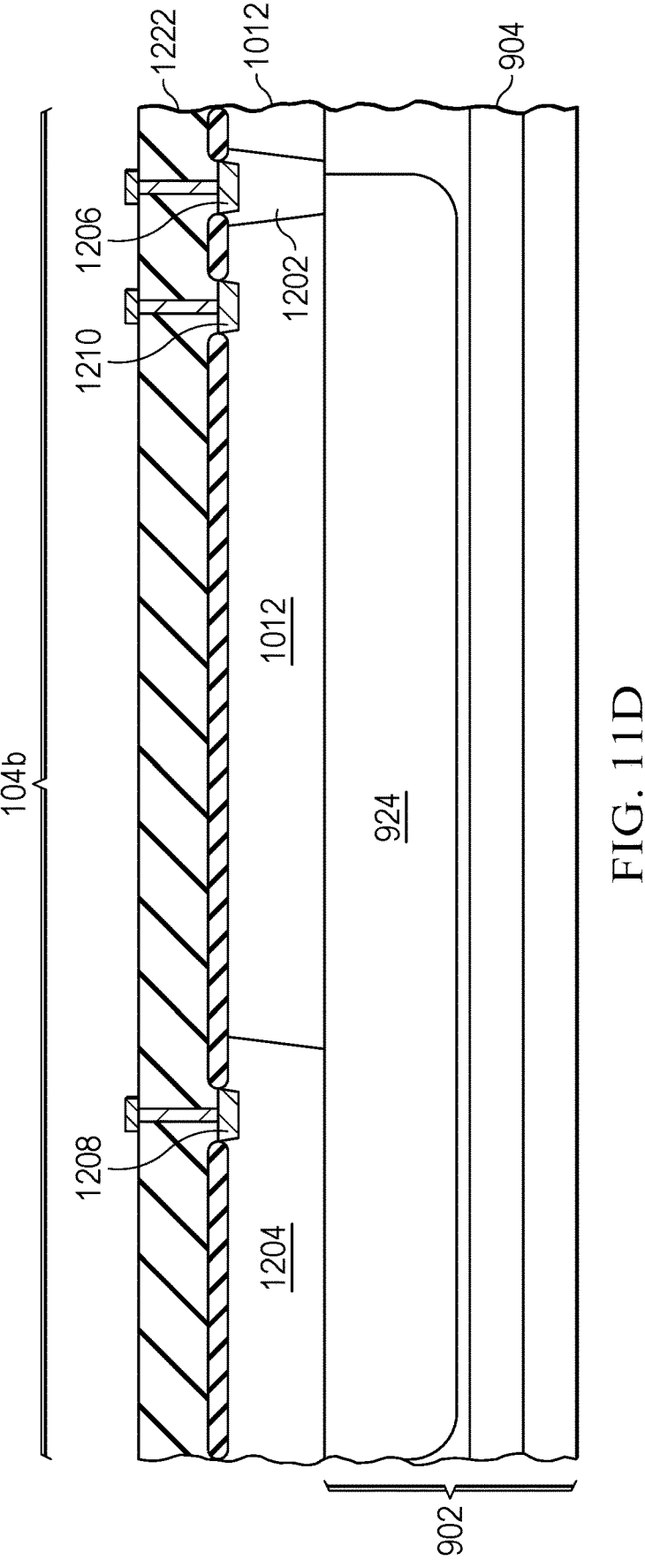

FIG. 8 is a graph illustrating activated p-type dopant concentrations according to various examples. The activated p-type dopant concentrations may be determined by spreading resistance profile (SRP) technique. In the examples shown by FIG. 8, the epitaxial layer 302 is in situ doped with a p-type dopant at a concentration of approximately $1 \times 10^{15}$ $cm^{-3}$, and the buried layer 112 is doped with an n-type dopant, such as antimony (Sb) and/or arsenic (As). A first profile 802 corresponds to an example in which the duration of the epitaxial growth of the cap layer 202 (e.g., duration between time t42 and time t43 in FIG. 4) is one second. The first profile 802 of activated p-type dopants is approximately $1 \times 10^{15}$ $cm^{-3}$ substantially throughout the epitaxial layer 302 and decreases slightly, but not below $8 \times 10^{14}$ $cm^{-3}$, proximate an interface with the semiconductor substrate 110.

A second profile 804 corresponds to a first example in which the duration of the epitaxial growth of the cap layer 202 (e.g., duration between time t42 and time t43) is two seconds. The second profile 804 of activated p-type dopants is approximately $1 \times 10^{15}$ $cm^{-3}$ substantially throughout the epitaxial layer 302 and decreases slightly, but not below $6 \times 10^{14}$ $cm^{-3}$, proximate an interface with the semiconductor substrate 110.

A third profile 806 corresponds to a second example in which the duration of the epitaxial growth of the cap layer 202 (e.g., duration between time t42 and time t43) is two seconds. The second profile 804 of activated p-type dopants is approximately $1 \times 10^{15}$ $cm^{-3}$ substantially throughout the epitaxial layer 302 and decreases slightly, but not below $5 \times 10^{14}$ $cm^{-3}$, proximate an interface with the semiconductor substrate 110.

A fourth profile 808 corresponds to an example in which the duration of the epitaxial growth of the cap layer 202 (e.g., duration between time t42 and time t43) is three seconds. The fourth profile 808 of activated p-type dopants is approximately $1 \times 10^{15}$ $cm^{-3}$ substantially throughout the epitaxial layer 302 and decreases to approximately $3 \times 10^{14}$ $cm^{-3}$ proximate an interface with the semiconductor substrate 110.

The decreases in the profiles 802, 804, 806, 808 proximate an interface between the epitaxial layer 302 and the semiconductor substrate 110 may result from auto-doping of the epitaxial layer 302 from dopants of the buried layer 112. The dopants of the buried layer 112 (e.g., n-type dopants) may be a conductivity type opposite from the dopants of the epitaxial layer 302 (e.g., p-type dopants) with which the epitaxial layer 302 was in situ doped. Hence, auto-doping of the epitaxial layer 302 may result in dopants with which the epitaxial layer 302 was in situ doped becoming deactivated (or compensated). Accordingly, reducing auto-doping may facilitate more of the dopants with which the epitaxial layer 302 was in situ doped to become activated.

Consistent with FIG. 8, therefore, a trough concentration of activated p-type dopants proximate an interface between the epitaxial layer 302 and the semiconductor substrate 110 in the second region 104 (e.g., in a region of the epitaxial layer 302 where the activated p-type dopants profile resembles a concave up shape with a smallest concentration in the region) is greater than approximately thirty percent of a concentration of activated p-type dopants in the epitaxial layer 302 in the second region 104 distal from the interface—e.g., in a region of the epitaxial layer 302 where the activated p-type dopants profile is relatively flat (or constant). For example, the trough and/or lowest concentration of activated p-type dopants of the profiles 802, 804, 806, 808 proximate the interface is greater than approximately thirty percent of approximately $1 \times 10^{15}$ $cm^{-3}$, which is at a region in the epitaxial layer 302 distal from the interface.

Further, FIG. 8 suggests that growth of the cap layer 202 with a short duration (sufficient to form a cap layer 202) may result in less auto-doping of the epitaxial layer 302. As shown, the first profile 802 (corresponding to a one second growth) has increased p-type dopant activation, and less deactivation from auto-doping, near the interface than the other profiles 804, 806, 808. Similarly, the second profile 804 and third profile 806 (corresponding to two seconds growth) have increased p-type dopant activation, and less deactivation from auto-doping, near the interface than the fourth profile 808 (corresponding to a three second growth).

As stated, the above description relating to FIG. 8 is in the context of the epitaxial layer 302 being in situ doped with a p-type dopant and the buried layer 112 being doped with an n-type dopant. In some examples, the epitaxial layer 302 may be in situ doped with a p-type dopant, and the buried layer 112 may be doped with a p-type dopant. In some examples, the dopants with which the epitaxial layer 302 may be doped in situ and the dopants resulting from auto-doping may accumulate for activated p-type dopants. In such examples, the activated p-type dopants may have a peak concentration within the epitaxial layer 302 proximate the interface between the epitaxial layer 302 and the semiconductor substrate 110. The peak concentration of activated p-type dopants may be less than one hundred seventy percent of a concentration of activated p-type dopants in the epitaxial layer 302 in the second region 104 distal from the interface. Generally (regardless of dopant conductivity type), at a region in the epitaxial layer 302 proximate an interface between the epitaxial layer 302 and the semiconductor substrate 110, a concentration of the dopant of the buried layer 112 that auto-dopes the epitaxial layer 302 may be less than (e.g., does not exceed) seventy percent of a concentration of the dopant of the epitaxial layer 302 with which the epitaxial layer was in situ doped.

FIGS. 9A-9D, 10A-10D, and 11A-11D are cross section views of semiconductor device structures during stages of manufacturing the semiconductor device structures according to some examples. Various types of devices are illustrated in the examples of FIGS. 9A-11D. Different combinations of types of devices and device structures may be implemented in different examples. Not all of the devices and devices structures in FIGS. 9A-11D are included in various implementations.

Referring to FIGS. 9A-9D, a semiconductor substrate 902 has first regions 102a, 102b, 102c, 102d and second regions 104a, 104b. The semiconductor substrate 902 may be like the semiconductor substrate 110 described above with respect to FIG. 1. As detailed subsequently, the first regions 102a, 102b, 102c, 102d may each include aspects of or be like the first region 102 in FIGS. 1 through 3, and the second regions 104a, 104b may each include aspects of or be like the second region 104 in FIGS. 1 through 3.

A p-type deep buried layer 904 is formed in the semiconductor substrate 902. The p-type deep buried layer 904 may be formed by implanting p-type dopants in the semiconductor substrate 902. In some examples, the p-type deep buried layer 904 may be p-doped with a p-type dopant at a concentration in a range from about $1\times10^{14}$ cm$^{-3}$ to about $5\times10^{15}$ cm$^{-3}$, e.g., lightly doped.

N-type buried layers (NBLs) 912, 914, 916, 918 are formed in the semiconductor substrate 902 in the first regions 102a, 102b, 102c. 102d, respectively. The NBLs 912, 914, 916, 918 may be formed using photolithography and implantation like described previously. In some examples, the NBLs 912, 914, 916, 918 may each be an n-type layer doped with an n-type dopant at a concentration in a range from about $1\times10^{17}$ cm$^{-3}$ to about $2\times10^{20}$ cm$^{-3}$, e.g., moderately to very heavily doped. More specifically, in some examples, the NBLs 912, 914, 916, 918 are each formed by implanting antimony (Sb) and/or arsenic (As) into the semiconductor substrate 902 in the first regions 102a, 102b, 102c, 102d.

N-type drift (Ndrift) regions 922, 924 are formed in the semiconductor substrate 902 in the second regions 104a, 104b, respectively. The Ndrift regions 922, 924 may be formed using photolithography and implantation like described previously. In some examples, the Ndrift regions 922, 924 may each be an n-type region doped with an n-type dopant at a concentration in a range from about $1\times10^{17}$ cm$^{-3}$ to about $2\times10^{20}$ cm$^{-3}$, e.g., moderately to very heavily doped.

Although the p-type deep buried layer 904 and the Ndrift regions 922, 924 may be formed in the second regions 104a. 104b by implantation, implant dosages and concentrations of the dopants used for these implantations may result in no or insignificant damage to the crystalline structure of the semiconductor substrate 902 in the second regions 104a, 104b. Hence, respective cap layers may be formed consistent with the description above and as described in the following.

Referring to FIGS. 10A-10D, cap layers 1002, 1004, 1006, 1008 are formed on the semiconductor substrate 110 in the first regions 102a, 102b, 102c, 102d and over the NBLs 912, 914, 916, 918, respectively. The cap layers 1002, 1004, 1006, 1008 may each be like the cap layer 202 previously described. As illustrated, no cap layer is formed over the Ndrift regions 922, 924 in the second regions 104a, 104b. An epitaxial layer 1012 is formed on the cap layers 1002, 1004, 1006, 1008 in the first regions 102a, 102b, 102c, 102d and on the semiconductor substrate 902 in the second regions 104a, 104b (and further, in any area in the first regions 102a, 102b, 102c, 102d where a cap layer is not formed). The epitaxial layer 1012 may be like the epitaxial layer 302 previously described. In some examples, the epitaxial layer 1012 is doped with a dopant that is the same conductivity type of the dopant type of the semiconductor substrate 902 and the p-type deep buried layer 904. For example, the epitaxial layer 1012 may be p-doped with a p-type dopant (e.g., boron) at a concentration in a range from about $1\times10^{14}$ cm$^{-3}$ to about $5\times10^{15}$ cm$^{-3}$, e.g., lightly doped.

Referring to FIGS. 11A-11D, subsequent processing to form the various device structures is performed. A p-type metal-oxide-semiconductor (MOS) transistor is formed in the first region 102a, and an n-type MOS transistor is formed in the first region 102b. An NPN bipolar junction transistor (BJT) is formed in the first region 102c, and a PNP BJT is formed in the first region 102d. An n-type laterally-diffused MOS (LDMOS) transistor is formed in the second region 104a. A junction field effect transistor (JFET) is formed in the second region 104b. Various examples may include: (i) any one or more of: the p-type MOS transistor, the n-type MOS transistor, the NPN BJT, and/or the PNP BJT, and (ii) any one or more of: the n-type LDMOS transistor and/or the JFET.

Various doped wells and doped regions described subsequently are formed in the epitaxial layer 1012. The doped wells and doped regions may be formed by photolithography and implantation like described previously. Concentrations of the doped wells and doped regions may be as would be understood for the device to be formed. Description of these aspects is omitted for brevity and clarity. Additionally, various isolation structures are illustrated in FIGS. 11A-11D that separate various doped regions. The isolation structures are illustrated as field oxide regions, such as local oxidation of silicon (LOCOS) structures, and in other examples, the isolation structures may be shallow trench isolations (STIs). Description of and reference to the isolation structures in FIGS. 11A-11D are omitted to not obscure other aspects described herein.

An n-well 1102, doped with an n-type dopant, is formed in the epitaxial layer 1012 in the first region 102a. P-type source/drain regions 1104, 1106, doped with a p-type dopant, are formed in the n-well 1102. An n-type substrate region 1108, doped with an n-type dopant, is formed in the n-well 1102. A gate dielectric layer 1110 is disposed over the epitaxial layer 1012 and laterally between the p-type source/drain regions 1104, 1106. The n-type substrate region 1108 is disposed on a side of the p-type source/drain region 1106 laterally opposite from the gate dielectric layer 1110 and the p-type source/drain region 1104. A gate electrode 1112 (e.g., including a conductive material, such as a metal, a doped semiconductor, the like, or a combination thereof) is disposed over the gate dielectric layer 1110. Sidewall spacers (no reference numeral) are disposed along respective sidewalls of the gate electrode 1112.

A p-well 1122, doped with a p-type dopant, is formed in the epitaxial layer 1012 in the first region 102b. N-type source/drain regions 1124, 1126, doped with an n-type dopant, are formed in the p-well 1122. A p-type substrate region 1128, doped with a p-type dopant, is formed in the p-well 1122. A gate dielectric layer 1130 is disposed over the epitaxial layer 1012 and laterally between the n-type source/drain regions 1124, 1126. The p-type substrate region 1128 is disposed on a side of the n-type source/drain region 1126 laterally opposite from the gate dielectric layer 1130 and the n-type source/drain region 1124. A gate electrode 1132 (e.g., including a conductive material, such as a metal, a doped semiconductor, the like, or a combination thereof) is disposed over the gate dielectric layer 1130. Sidewall spacers (no reference numeral) are disposed along respective sidewalls of the gate electrode 1132.

A p-well 1142, doped with a p-type dopant, is formed in the epitaxial layer 1012 in the first region 102c. An n-well 1144, doped with an n-type dopant, is formed in the epitaxial layer 1012 in the first region 102c and laterally circumscribing the p-well 1142. An n-type emitter region 1146, doped with an n-type dopant, and a p-type base region 1148, doped with a p-type dopant, are formed in the p-well 1142. An n-type collector region 1150, doped with an n-type dopant, is formed in the n-well 1144.

An n-well 1162, doped with an n-type dopant, is formed in the epitaxial layer 1012 in the first region 102d. A p-layer 1164, doped with a p-type dopant, is formed in the epitaxial layer 1012 under the n-well 1162 (e.g., vertically between the n-well 1162 and the NBL 918). A p-well 1166, doped with a p-type dopant, is formed in the epitaxial layer 1012 in the first region 102d and laterally circumscribing the n-well 1162. The p-well 1166 extends to the p-layer 1164. An n-well 1168, doped with an n-type dopant, is formed in the epitaxial layer 1012 in the first region 102d and laterally circumscribing the p-well 1166 and p-layer 1164. A p-type emitter region 1170, doped with a p-type dopant, and an n-type base region 1172, doped with an n-type dopant, are formed in the n-well 1162. A p-type collector region 1174, doped with a p-type dopant, is formed in the p-well 1166. An n-type isolation region 1176, doped with an n-type dopant, is formed in the n-well 1168.

A p-type diffusion well (Dwell) 1182, doped with a p-type dopant, and an n-well 1184, doped with an n-type dopant, are formed in the epitaxial layer 1012 in the second region 104a. The p-type Dwell 1182 and the n-well 1184 are laterally disposed some distance apart. The p-type Dwell 1182 and the n-well 1184 both extend to the Ndrift region 922 in the semiconductor substrate 902. An n-type source region 1186, doped with an n-type dopant, is formed in the p-type Dwell 1182, and an n-type drain region 1188, doped with an n-type dopant, is formed in the n-well 1184. A gate dielectric layer 1190 is disposed over the epitaxial layer 1012 and laterally extending proximate to the n-type source region 1186 and some distance from the n-type drain region 1188. A gate electrode 1192 (e.g., including a conductive material, such as a metal, a doped semiconductor, the like, or a combination thereof) is disposed over the gate dielectric layer 1190 and a portion of an isolation region that is between the n-type source region 1186 and n-type drain region 1188. Sidewall spacers (no reference numeral) are disposed along respective sidewalls of the gate electrode 1192.

A first n-well 1202 and a second n-well 1204, each doped with an n-type dopant, are formed in the epitaxial layer 1012 in the second region 104b. The first n-well 1202 and the second n-well 1204 are laterally disposed some distance apart. The first n-well 1202 and the second n-well 1204 both extend to the Ndrift region 924 in the semiconductor substrate 902. An n-type source region 1206, doped with an n-type dopant, is formed in the first n-well 1202, and an n-type drain region 1208, doped with an n-type dopant, is formed in the second n-well 1204. A p-type gate region 1210, doped with a p-type dopant, is formed in the epitaxial layer 1012 laterally between and spaced some respective distances from the first n-well 1202 and the second n-well 1204.

A dielectric layer 1222 is formed over the epitaxial layer 1012. More specifically, the dielectric layer 1222 is formed over the various doped regions, isolation structures, gate electrodes, and sidewall spacers formed in the first regions 102a. 102b, 102c, 102d and the second regions 104a, 104b. The dielectric layer 1222 may include any of an etch stop layer, a pre-metal dielectric (PMD) layer, an inter-layer dielectric (ILD) layer, the like, or a combination thereof. Various metal contacts (no reference numeral) are formed through the dielectric layer 1222 and electrically connect to respective doped regions in the epitaxial layer 1012 and gate electrodes over the epitaxial layer 1012. Metal lines (no reference numeral) in a first metal layer are formed over the dielectric layer 1222 and electrically connect to respective metal contacts.

According to various examples consistent with FIGS. 9A-9D through 11A-11D, auto-doping of the epitaxial layer 1012, particularly, in the second regions 104a, 104b (in which the LDMOS transistor and the JFET are formed), from dopants from the NBL(s) in the first region(s) 102a, 102b, 102c, 102d may be reduced—e.g., by performing a purge (and forming a cap layer) as described herein.

Figures 12, 13:
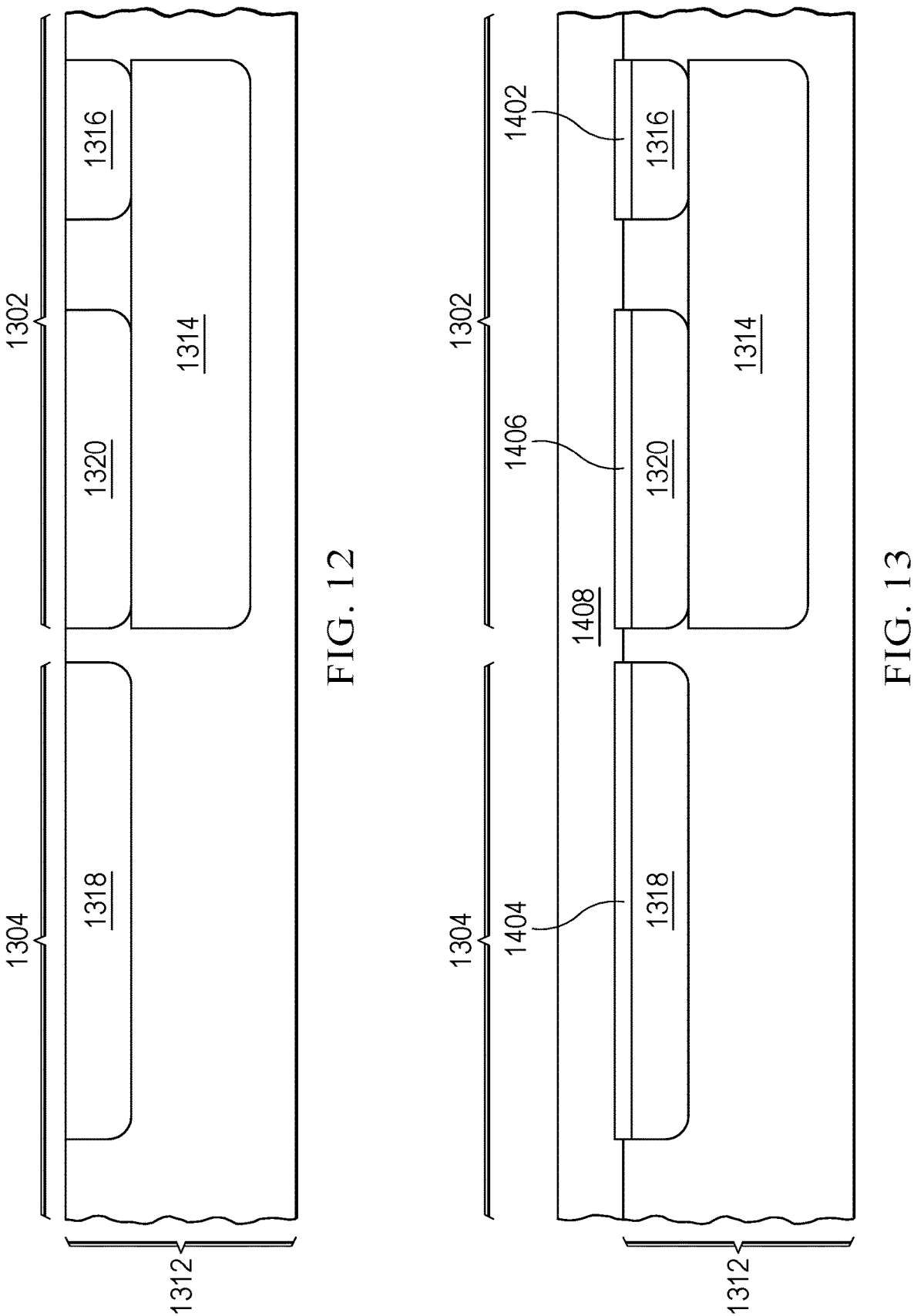
FIGS. 12, 13, and 14 are cross section views of a semiconductor device structure during stages of manufacturing the semiconductor device structure according to some examples.
Figure 14:
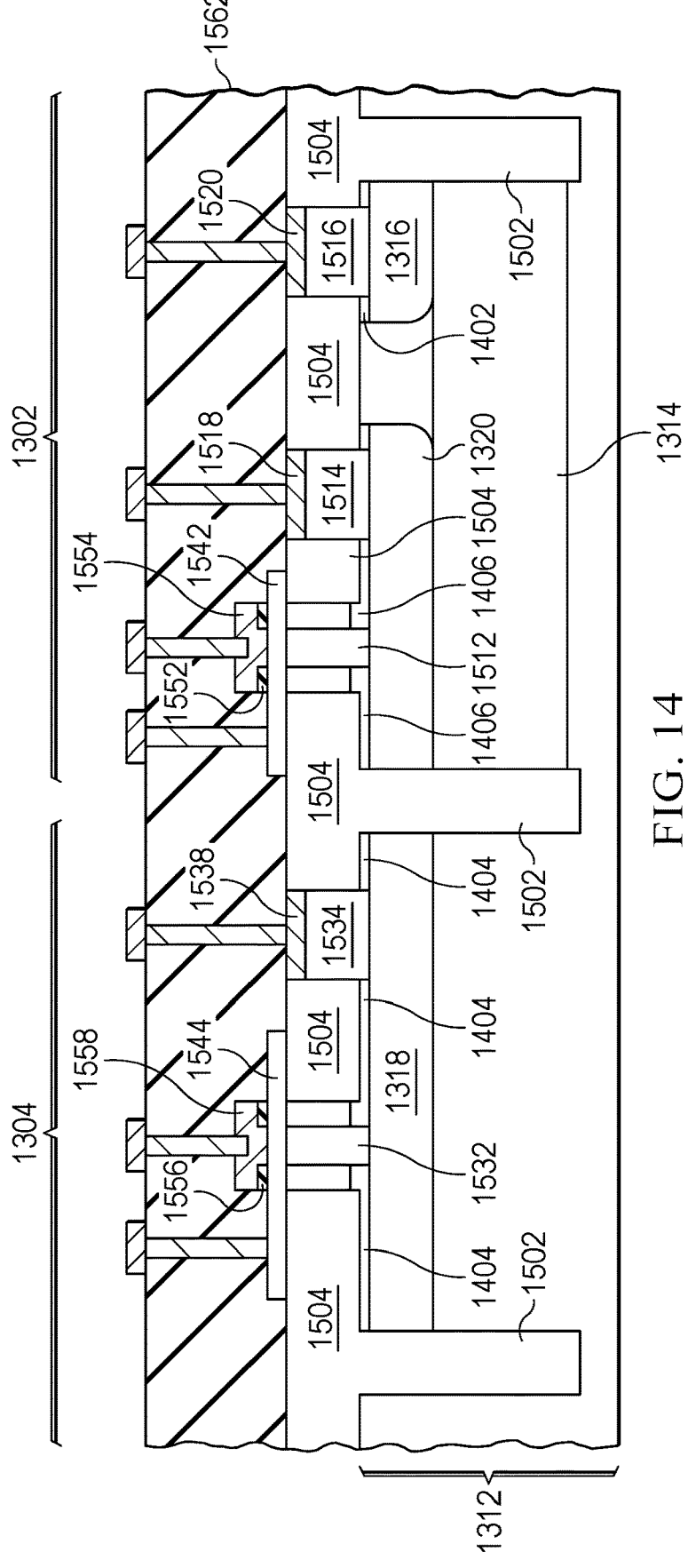

FIGS. 12, 13, and 14 are cross section views of a semiconductor device structure during stages of manufacturing the semiconductor device structure according to some examples. The semiconductor device structure includes a bipolar complementary MOS (BiCMOS) structure.

Referring to FIG. 12, a semiconductor substrate 1312 has a first region 1302 and a second region 1304. The semiconductor substrate 1312 may be like the semiconductor substrate 110 described above with respect to FIG. 1. As detailed subsequently, in some respects, the first region 1302 may include aspects of or be like either the first region 102 or the second region 104 in FIGS. 1 through 3, and the second region 1304 may include aspects of or be like the other of the first region 102 or the second region 104 in FIGS. 1 through 3.

An n-type deep buried layer 1314 is formed in the semiconductor substrate 1312. The n-type deep buried layer 1314 may be formed by implanting n-type dopants in the semiconductor substrate 1312. In some examples, the n-type deep buried layer 1314 may be n-doped with an n-type dopant at a concentration in a range from about $1 \times 10^{14}$ cm$^{-3}$ to about $5 \times 10^{15}$ cm$^{-3}$, e.g., lightly doped.

NBLs 1316, 1318 are formed in the semiconductor substrate 1312 in the first region 1302 and the second region 1304, respectively. The NBLs 1316, 1318 may be formed using photolithography and implantation like described previously. In some examples, the NBLs 1316, 1318 may each be an n-type layer doped with an n-type dopant at a concentration in a range from about $1 \times 10^{17}$ cm$^{-3}$ to about $2 \times 10^{20}$ cm$^{-3}$, e.g., moderately to very heavily doped. More specifically, in some examples, the NBLs 1316, 1318 are each formed by implanting antimony (Sb) and/or arsenic (As) into the semiconductor substrate 1312 in the first region 1302 and the second region 1304.

A p-type buried layer (PBL) 1320 is formed in the semiconductor substrate 1312 in the first region 1302 laterally spaced from the NBL 1316 in the first region 1302. The PBL 1320 may be formed using photolithography and implantation like described previously. In some examples, the PBL 1320 may be a p-type layer doped with a p-type dopant at a concentration in a range from about $1 \times 10^{17}$ cm$^{-3}$ to about $2 \times 10^{20}$ cm$^{-3}$, e.g., moderately to very heavily doped. More specifically, in some examples, the PBL 1320 is formed by implanting boron (B) into the semiconductor substrate 1312 in the first region 1302. The boron (B) implanted as the PBL 1320 may be susceptible to out-diffusion resulting in auto-doping and may cause damage to the crystalline structure of the semiconductor substrate 1312.

Referring to FIG. 13, cap layers 1402, 1404 are formed on the semiconductor substrate 110 in the first region 1302 and the second region 1304 and over the NBLs 1316, 1318, respectively. A cap layer 1406 is formed on the semiconductor substrate 110 in the first region 1302 and over the PBL 1320. The cap layers 1402, 1404, 1406 may each be like the cap layer 202 previously described. An epitaxial layer 1408 is formed on the cap layers 1402, 1404, 1406 in the first region 1302 and the second region 1304 and on the semiconductor substrate 1312 in any area where a cap layer is not formed. The epitaxial layer 1408 may be like the epitaxial layer 302 previously described.

Referring to FIG. 14, subsequent processing to form the device structures is performed. A PNP BJT is formed in the first region 1302, and an NPN BJT is formed in the second region 1304. Various doped wells and doped regions described subsequently are formed in the epitaxial layer 1408. The doped wells and doped regions may be formed by photolithography and implantation like described previously. Concentrations of the doped wells and doped regions may be as would be understood for the device to be formed. Description of these aspects is omitted for brevity and clarity.

Isolation structures are illustrated in FIG. 14 that separate various doped regions. An isolation structure, as illustrated in FIG. 14, may include a deep trench isolation (DTI) 1502 and/or an STI 1504. Other isolation structures may be implemented. DTIs 1502 may also define, at least in part, the first region 1302 and the second region 1304.

A first p-well 1512 and a second p-well 1514, each doped with a p-type dopant, are formed in the epitaxial layer 1408 in the first region 1302 and extending to the PBL 1320. A first n-well 1516, doped with an n-type dopant, is formed in the epitaxial layer 1408 in the first region 1302 and extending to the NBL 1316. A p-type collector region 1518, doped with a p-type dopant, is formed in the second p-well 1514. The first p-well 1512, PBL 1320, second p-well 1514, and p-type collector region 1518 may together form a collector of the PNP BJT. An n-type substrate region 1520, doped with an n-type dopant, is formed in the first n-well 1516.

A second n-well 1532 and a third n-well 1534, each doped with an n-type dopant, are formed in the epitaxial layer 1408 in the second region 1304 and extending to the NBL 1318. An n-type collector region 1538, doped with an n-type dopant, is formed in the third n-well 1534. The second n-well 1532, NBL 1318, third n-well 1534, and n-type collector region 1538 may together form a collector of the NPN BJT.

An n-type base layer 1542, doped with an n-type dopant, is formed on the epitaxial layer 1408 in the first region 1302 and contacting the first p-well 1512. A p-type base layer 1544, doped with a p-type dopant, is formed on the epitaxial layer 1408 in the second region 1304 and contacting the second n-well 1532.

A first dielectric layer 1552 is on the n-type base layer 1542 and has an opening therethrough. A p-type emitter layer 1554, doped with a p-type dopant, is on the first dielectric layer 1552. The p-type emitter layer 1554 is through the opening through the first dielectric layer 1552 and contacts the n-type base layer 1542.

A second dielectric layer 1556 is on the p-type base layer 1544 and has an opening therethrough. An n-type emitter layer 1558, doped with an n-type dopant, is on the second dielectric layer 1556. The n-type emitter layer 1558 is through the opening through the second dielectric layer 1556 and contacts the p-type base layer 1544.

A dielectric layer 1562 is formed over the epitaxial layer 1408. More specifically, the dielectric layer 1562 is formed over the various doped regions, isolation structures, base layers, and emitter layers formed in the first region 1302 and the second region 1304. The dielectric layer 1562 may include any of an etch stop layer, a PMD layer, an ILD layer, the like, or a combination thereof. Various metal contacts (no reference numeral) are formed through the dielectric layer 1562 and electrically connect to respective doped regions in the epitaxial layer 1408, base layers, and emitter layers. Metal lines (no reference numeral) in a first metal layer are formed over the dielectric layer 1562 and electrically connect to respective metal contacts.

According to various examples consistent with FIGS. 12 through 14, auto-doping of the epitaxial layer 1408 in the first region 1302 and/or the second region 1304 from dopants from the NBL(s) 1316, 1318 in the first region 1302 and/or second region 1304 and/or from dopants from the PBL 1320 in the first region may be reduced—e.g., by performing a purge (and forming a cap layer) as described herein.

Although various examples have been described in detail, it should be understood that various changes, substitutions, and alterations can be made therein without departing from the scope defined by the appended claims.

What is claimed is:

1. A semiconductor device structure, comprising:
   a semiconductor substrate having a first region and a second region, the first region including a doped layer doped with a first dopant in the semiconductor substrate;
   a cap layer on the doped layer in the first region; and
   an epitaxial layer on the cap layer in the first region and on the semiconductor substrate in the second region, wherein the epitaxial layer is in direct contact with the semiconductor substrate in the second region.

2. The semiconductor device structure of claim 1, wherein:
   a concentration of the first dopant in the semiconductor substrate in the second region distal from an interface between the epitaxial layer and the semiconductor substrate is represented in a form $c \times 10^m$ cm$^{-3}$, wherein c is greater than or equal to one and less than ten, and m is an integer; and
   a concentration of the first dopant in the epitaxial layer at the interface is equal to or less than greater of: (i) $(c+5) \times 10^m$ cm$^{-3}$ and (ii) $8 \times 10^{14}$ cm$^{-3}$.

3. The semiconductor device structure of claim 1, wherein:
   a concentration of the first dopant in the epitaxial layer distal from an interface between the epitaxial layer and the semiconductor substrate is represented in a form $c \times 10^m$ cm$^{-3}$, wherein c is greater than or equal to one and less than ten, and m is an integer; and
   a concentration of the first dopant in the epitaxial layer at the interface is equal to or less than greater of: (i) $(c+5) \times 10^m$ cm$^{-3}$ and (ii) $8 \times 10^{14}$ cm$^{-3}$.

4. The semiconductor device structure of claim 1, wherein a concentration of the first dopant in the epitaxial layer at an interface between the epitaxial layer and the semiconductor substrate is less than seventy percent of a concentration of a second dopant in the epitaxial layer in the second region.

5. The semiconductor device structure of claim 1, wherein no doped layer doped with the first dopant is in the semiconductor substrate in the second region.

6. The semiconductor device structure of claim 1, wherein the first dopant includes antimony, arsenic, or a combination thereof.

7. The semiconductor device structure of claim 1, wherein the first dopant includes boron.

8. The semiconductor device structure of claim 1, wherein the epitaxial layer includes a second dopant having a conductivity type opposite from the first dopant, and a concentration of the second dopant proximate an interface between the epitaxial layer and the semiconductor substrate is greater than thirty percent of a concentration of the second dopant in the epitaxial layer in the second region distal from the interface.

9. The semiconductor device structure of claim 1, wherein the epitaxial layer includes a second dopant having a conductivity type same as the first dopant, and a concentration of the second dopant proximate an interface between the epitaxial layer and the semiconductor substrate is less than one hundred seventy percent of a concentration of the second dopant in the epitaxial layer in the second region distal from the interface.

10. The semiconductor device structure of claim 1, further comprising:

a first device including a first doped region in the epitaxial layer in the first region, the first doped region being disposed over the doped layer; and a second device including a second doped region in the epitaxial layer in the second region, the second doped region being doped with a second dopant of a same conductivity type as the first dopant, the epitaxial layer being doped with a third dopant having a conductivity type opposite from the first dopant.

11. A semiconductor device structure, comprising:

a silicon substrate having a first region and a second region, the silicon substrate including in the first region a buried layer;

a silicon cap layer on the silicon substrate over the buried layer in the first region; and a p-type silicon layer on the silicon cap layer in the first region and on the silicon substrate in the second region.

12. The semiconductor device structure of claim 11, further comprising:

a first device in the first region, the first device including a doped region in the p-type silicon layer, wherein the first device includes an n-type metal-oxide-semiconductor (MOS) transistor, a p-type MOS transistor, an NPN bipolar junction transistor (BJT), or a PNP BJT; and a second device in the second region, the second device including a doped region in the p-type silicon layer, wherein the second device includes a laterally-diffused MOS (LDMOS) transistor or a junction field effect transistor (JFET).

13. The semiconductor device structure of claim 11, further comprising:

an NPN bipolar junction transistor (BJT) in the first region, wherein the buried layer forms at least a portion of a collector of the NPN BJT; and a PNP BJT in the second region.

14. The semiconductor device structure of claim 11, wherein the buried layer is doped with antimony, arsenic, or a combination thereof.

15. The semiconductor device structure of claim 11, wherein the buried layer is doped with boron.

* * * * *